United States Patent
Nguyen

(10) Patent No.: US 9,397,676 B1
(45) Date of Patent: Jul. 19, 2016

(54) LOW POWER SWITCHING TECHNIQUES FOR DIGITAL-TO-ANALOG CONVERTERS

(71) Applicant: ANALOG DEVICES, INC., Norwood, MA (US)

(72) Inventor: Khiem Quang Nguyen, Tewksbury, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 14/868,616

(22) Filed: Sep. 29, 2015

(51) Int. Cl.
*H03M 1/00* (2006.01)
*H03M 1/74* (2006.01)

(52) U.S. Cl.
CPC .............. *H03M 1/002* (2013.01); *H03M 1/742* (2013.01)

(58) Field of Classification Search
CPC ............................. H03M 1/002; H03M 1/742
USPC ......... 341/143, 155, 144, 136, 122, 118, 120; 327/437
See application file for complete search history.

(56) References Cited

U.S. PATENT DOCUMENTS

| | | | |
|---|---|---|---|
| 5,654,710 A | 8/1997 | Oh et al. | |
| 7,079,063 B1 | 7/2006 | Nguyen et al. | |
| 7,307,568 B1 | 12/2007 | Nhuyen | |
| 7,777,658 B2 | 8/2010 | Nguyen et al. | |
| 7,812,753 B1 | 10/2010 | Myles et al. | |
| 7,924,197 B1* | 4/2011 | Liu | H03M 1/002 341/136 |
| 7,994,957 B2 | 8/2011 | O'Donnell et al. | |
| 8,164,502 B2 | 4/2012 | Katsis et al. | |
| 8,269,661 B2 | 9/2012 | Corsi et al. | |
| 8,842,032 B2 | 9/2014 | Nguyen et al. | |
| 2012/0306678 A1* | 12/2012 | Hezar | H03M 1/747 341/146 |
| 2014/0145867 A1* | 5/2014 | Bandyopadhyay | H03M 1/0617 341/144 |
| 2015/0171891 A1 | 6/2015 | Stoops et al. | |

OTHER PUBLICATIONS

Khiem Nguyen et al., "A 108 dB SNR, 1.1 mW Oversampling Audio DAC With a Three-level DEM Technique", IEEE Xplore Abstract, IEEE.org, Sep. 9, 2015, 2 pages.

* cited by examiner

*Primary Examiner* — Peguy Jean Pierre
(74) *Attorney, Agent, or Firm* — Patent Capital Group

(57) ABSTRACT

Embodiments of the present disclosure provide improved switching techniques for controlling three-level DAC cells employing a return-to-hold scheme. Disclosed techniques include switching a DAC cell off for at least the duration of a time period between two hold periods while a digital value of zero is being converted. Because the DAC cell is switched off between two hold periods, the current source drain voltage is not disturbed during the critical transient times when D flip-flop outputs change, which happens during the hold periods, in response to change of digital values to be converted. In this manner, power consumption may be reduced while preserving the high performance properties of a three-level return-to-hold DAC.

26 Claims, 18 Drawing Sheets

| B | $\overline{B}$ | Z |
|---|---|---|
| 0 | 0 | 1 |
| 0 | 1 | 0 |
| 1 | 0 | 0 |
| 1 | 1 | ILLEGAL |

This condition does not exist

FIGURE 7
(prior art)

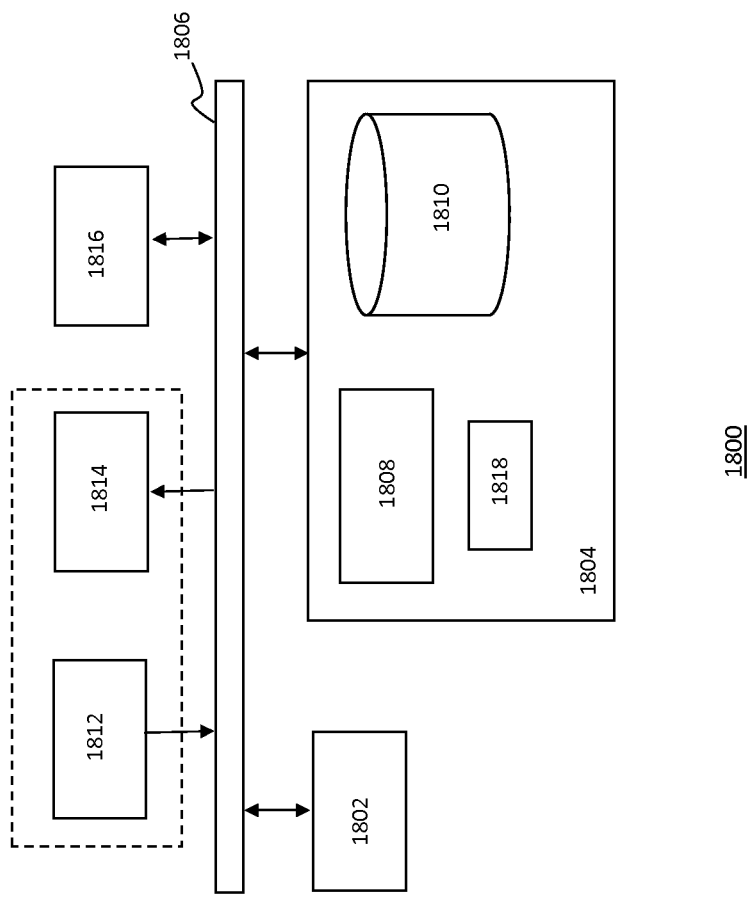

LOW POWER SWITCHING TECHNIQUES FOR DIGITAL-TO-ANALOG CONVERTERS

TECHNICAL FIELD OF THE DISCLOSURE

The present disclosure relates generally to digital-to-analog converters and, more particularly, to methods and systems for controlling three-level digital-to-analog converter cells to reduce power consumption.

BACKGROUND

Real-world analog signals such as temperature, pressure, sound, or images are routinely converted to a digital representation that can be easily processed in modern digital systems. In many systems, this digital information must be converted back to an analog form to perform some real-world function. The circuits that perform this step are digital-to-analog converters (DACs), and their outputs may be used to drive a variety of devices. Loudspeakers, video displays, motors, mechanical servos, radio frequency (RF) transmitters, and temperature controls are just a few diverse examples. DACs are often incorporated into digital systems in which real-world signals are digitized by analog-to-digital converters (ADCs), processed, and then converted back to analog form by DACs. In these systems, the performance required of the DACs will be influenced by the capabilities and requirements of the other components in the system.

Power consumption is an issue that engineers continuously try to improve on. Improvements could be made with respect to reducing power consumption of a DAC.

OVERVIEW

Embodiments of the present disclosure provide mechanisms to control three-level DAC cells of a DAC. As used herein, the term "DAC cell," sometimes also referred to as "DAC unit," refers to a current steering DAC element that includes two current sources, e.g. a pMOS and an nMOS current sources, as well as six switching mechanisms referred to herein as "switches" b, b_bar, and z, e.g. as shown in FIG. 8.

The mechanisms described herein may be applicable to current steering DACs, and may be especially attractive for oversampling sigma-delta audio DAC applications.

One aspect of the present disclose provides a method for controlling a three-level current steering DAC cell configured to maintain an analog output associated with a conversion of each digital value to a next digital value for a non-zero hold time period associated with the each digital value changing to the next digital value. As is known in the art, a three-level DAC cell refers to a DAC element that responds to +1, 0, and −1 digital input (i.e., 3 levels of digital input). The method includes determining that, for a first digital value changing to a second digital value, the second digital value is zero, and preventing the DAC cell from conducting current (i.e., switching the DAC cell off) at least during a time period (shown as time period A in the FIGUREs) between the end of a hold period associated with the change of the first digital value to the second digital value and the beginning of a next hold period (i.e. the hold period associated with a change of the second digital value to a third digital value).

In some embodiments, the method may further include a step of identifying that the second digital value is the first zero value of k consecutive zero digital values, k being an integer equal to or greater than two. In such an embodiment, the step of preventing the DAC cell from conducting current may involve preventing the DAC cell from conducting current during a continuous time period (time period B in the FIGUREs) between the end of the hold period associated with the change of the first digital value to the second digital value and the beginning of a hold period associated with a change of a digital value that is one before last of the k consecutive zero digital values (i.e. $(k-1)_{th}$ digital value of k consecutive zero digital values) to a digital value that is the last digital value of the k consecutive zero digital values (i.e. $k_{th}$ digital value of k consecutive zero digital values).

In some further embodiments of the method described in the previous paragraph, the method may further include determining that a digital value immediately following the last digital value of the k consecutive zero digital values is a non-zero value, and allowing the DAC cell to conduct current (i.e., switching the DAC cell on) during at least a portion of the hold period associated with the change of the digital value that is one before last of the k consecutive zero digital values to the last digital value of the k consecutive zero digital values. In some embodiments, the method may also include preventing the DAC cell from conducting current during a time period (time period A4 in the FIGUREs) between the end of the hold period associated with the change of the digital value that is one before last of the k consecutive zero digital values to the last digital value of the k consecutive zero digital values and the beginning of a hold period associated with a change of the last digital value of the k consecutive zero digital values to the digital value immediately following the last digital value of the k consecutive zero digital values. While, in other embodiments, the DAC cell is allowed to conduct current during the latter time period (time period A4 in the FIGUREs).

In some embodiments, the step of preventing the DAC cell from conducting current may involve preventing the DAC cell from conducting current during a continuous time period between the end of the hold period associated with the change of the first digital value to the second digital value and the beginning of a hold period associated with a change of the last digital value of the k consecutive zero digital values (i.e. $k_{th}$ digital value of k consecutive zero digital values) to a next digital value.

In some embodiments, the method may also include delaying input data samples by a number of clock cycles sufficient to allow for a look-ahead set up time to identify digital values within a sequence of k consecutive digital values.

As will be appreciated by one skilled in the art, aspects of the present disclosure may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing DACs or DAC controllers, etc.) or be stored upon manufacturing of these devices and systems.

Other features and advantages of the disclosure are apparent from the following description, and from the claims.

BRIEF DESCRIPTION OF THE DRAWINGS

FIG. 7 illustrates a truth table for the control signal z as shown in FIG. 6;

FIG. 18 depicts a block diagram illustrating an exemplary data processing system, according to some embodiments of the disclosure.

DESCRIPTION OF EXAMPLE EMBODIMENTS OF THE DISCLOSURE

Basics of DACs

A DAC is a device that produces a quantized (discrete step) analog output in response to a binary digital input code. The digital input may be e.g. input from transistor logic (TTL), emitter-coupled logic (ECL), complementary metal-oxide-semiconductor (CMOS) circuits, or low-voltage differential signaling (LVDS), while the analog output may be either a voltage or a current. To generate the output, a reference quantity (either a voltage or a current) is divided into binary and/or linear fractions. Then the digital input drives switches to the individual DAC cells, which could comprise current sources, voltage sources, resistors, capacitors, etc., that combine an appropriate number of these fractions to produce the output, a process sometimes referred to as "encoding." The number and size of the fractions reflect the number of possible digital input codes, which is a function of converter resolution or the number of bits (N) in the digital input code. For example, N bits could result in $2^N$ possible codes.

In a DAC, a digital signal is provided to a coding element (encoder) which, in turn, switches the individual DAC cells on and off to convert digital input values of the digital signal to analog values. The number of DAC cells switched on at the same time represents an analog value of the resulting analog signal at that time.

For example, a DAC with 15 DAC cells is capable of converting a 4-bit digital value (i.e., N=4) to one of 16 different analog values ($2^N$, so for N=4 the number of possible codes is $2^4$=16) by switching the appropriate DAC cells on. For example, to convert a digital value 0110 to an analog value—six DAC cells may be switched on, to convert a digital value 0111 to an analog value—seven DAC cells may be switched on, to convert a digital value 1001 to an analog value—nine DAC cells may be switched on, to convert a digital value 1011 to an analog value—eleven DAC cells may be switched on, and so on.

Basics of Current Steering DACs

Figure 1:
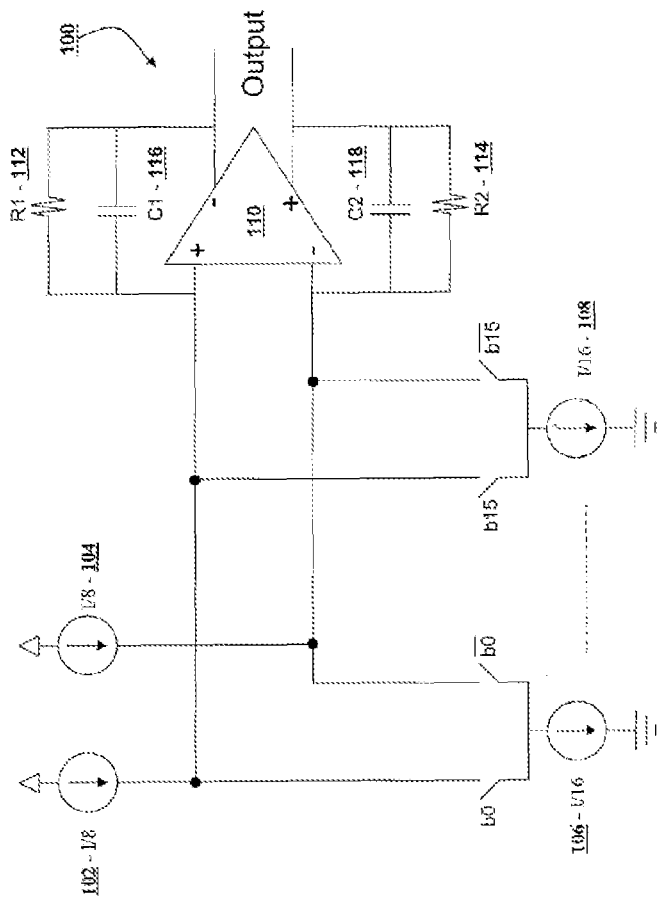
FIG. 1 illustrates a typical implementation of a 16-bit, two-level logic thermometer code current steering DAC.

Current steering topology is a commonly used approach in industry to realize DACs. Due to its simplicity and flexibility, this topology is employed in a large combination of high speed or high resolution applications. FIG. 1 illustrates a typical implementation of a 16-bit thermometer-code current steering DAC 100. The DAC consists of a bank of current steering cells 102, 104, 106, and 108, amplifier 110, a pair of feedback resistors 112 and 114, and in some cases a pair of capacitors, C1 116 and C2 118. Capacitors 116 and 118 effectively slow down the step output waveform to help reduce the amplifier slew rate requirement. The control bits and their complementary version are, in the simplest form, the Q and QB outputs of a D-flip flop array. The inputs of these D-flip flops are the digital DAC codes. The circuit operation is quite simple in that the digital codes control how many cells will be directed to the appropriate summing junction of the amplifier. A clock which defines the conversion rate of the DAC is used to synchronize all output transitions of the control bits via the D-flip flops.

Sigma-delta DACs provide for a means to achieve high resolution and low distortion at a relatively low cost compared to traditional Nyquist converters. In the past, there have been many realizations of these very high resolution DACs which used current steering topology in their output stage.

Basics of Return-to-Hold Switching Scheme for DACs

A very well understood problem associated with current steering DAC is the inter-symbol-interference (ISI). This ISI problem is the result of un-equal rise and fall time in the waveform of the current pulse delivered to the output by each current cell. Consequently, the present value of the DAC output depends on its previous value. The net effect is a major degradation in the total harmonic distortion (THD) and noise performance of the DAC.

Figure 2:
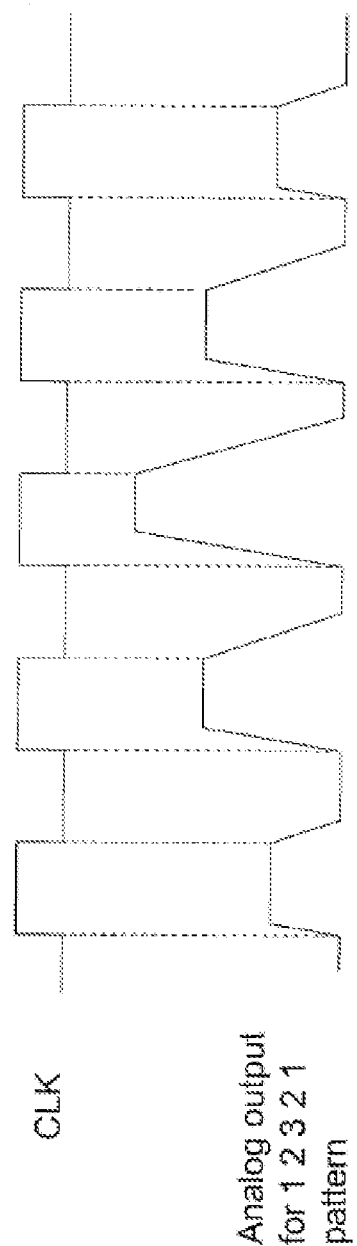
FIG. 2 illustrates a return-to-zero waveform.

Prior art techniques, such as e.g. a return-to-zero (RTZ) technique, have been used to minimize the effect of ISI. The principle of RTZ is illustrated in FIG. 2. RTZ forces each current cell to turn off for a duration, typically half of the clock period. Hence, the output of the DAC always starts from zero at the beginning of each clock period. The ISI is thus completely removed. However, this technique has major drawbacks such as a high slew rate, bandwidth requirement and high power consumption in the amplifier, and additional high frequency content being introduced as the result of returning to the zero state.

Figure 3:
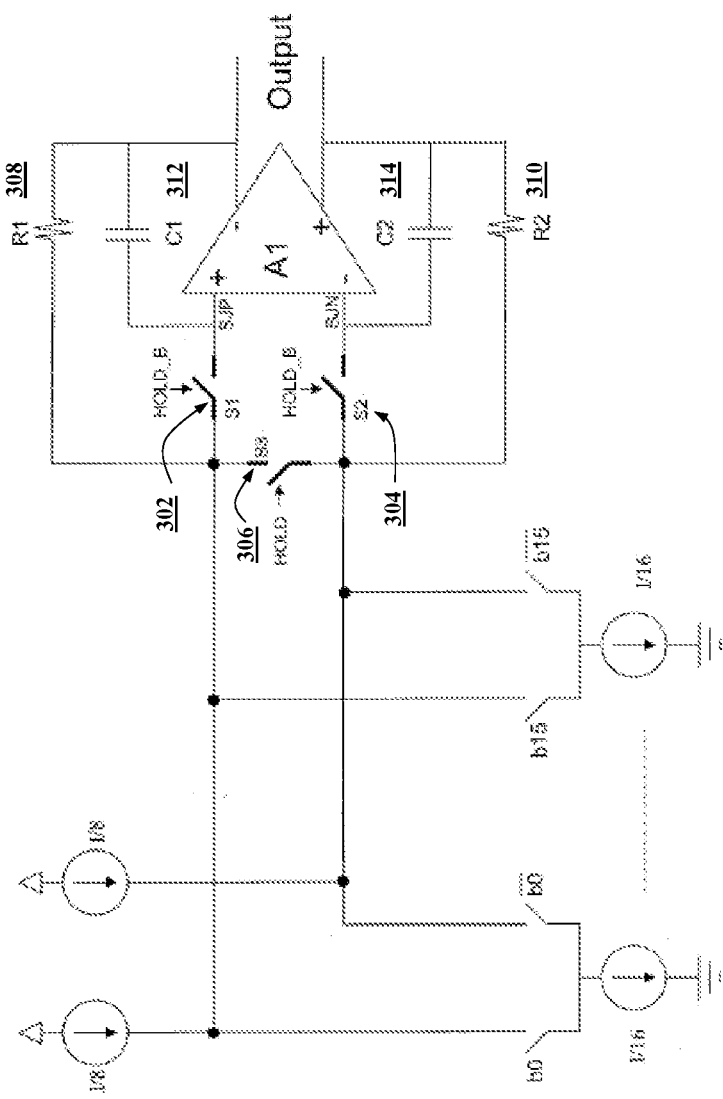
FIG. 3 illustrates a block diagram of a return-to-hold scheme.
Figure 4:
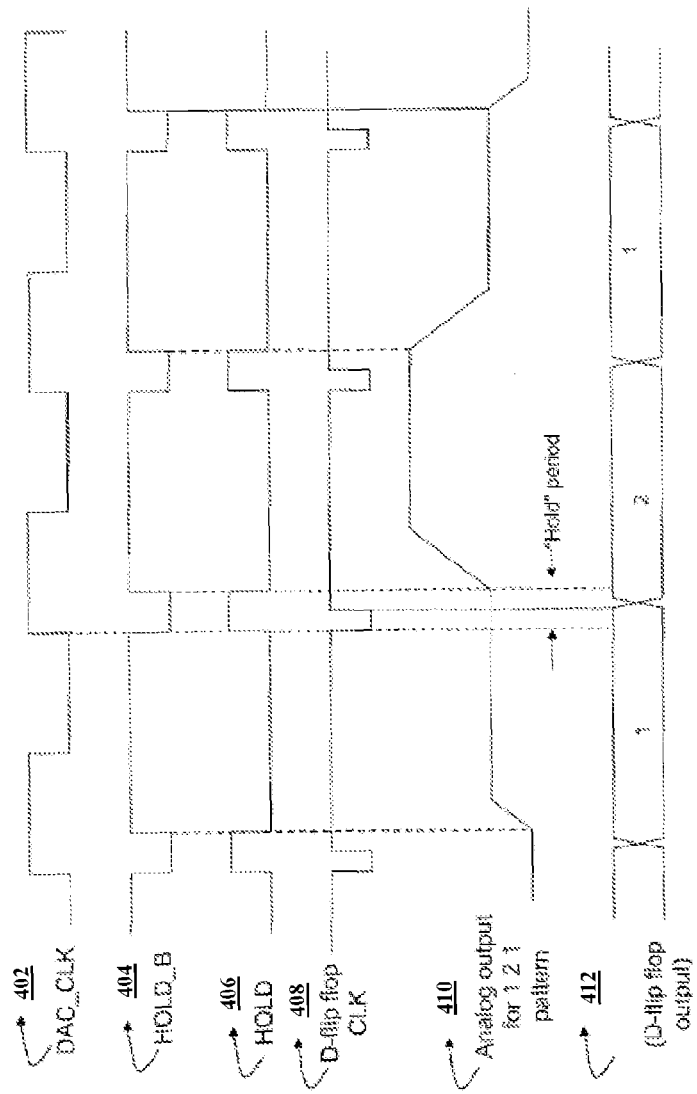
FIG. 4 illustrates a timing diagram of the return-to-hold scheme.

Therefore, as an alternative to RTZ, a technique referred to as a "return-to-hold" (RTH) has been proposed. FIG. 3 illustrates a block diagram of a return-to-hold scheme implemented in the current steering DAC output stage with the addition of switches S1 302, S2 304, and S3 306. Switches S1 302 and S2 304 are controlled by a HOLD_B signal while switch S3 306 is controlled by a HOLD signal. The timing diagram of the clock, the current cell control bits and the control signals are shown in FIG. 4.

The operation of the RTH circuit shown in FIG. 3 may be described as follows. When the rising edge of the clock 402 arrives, HOLD_B 404 becomes LOW and disconnects the feedback resistors R1 308 and R2 310 from the summing junctions of the I-to-V converter by turning off switches S1 302 and S2 304. At the same time, HOLD 406 becomes HIGH and connects the left hand sides of the resistors R1 308 and R2 310 via switch S3 306. The outputs of the current cells are also short circuited together via switch S3 306. During this "hold" period, the I-to-V converter is in the "hold" mode, its output voltage is kept at the same value by the capacitors C1 312 and C2 314. Hence, the switching scheme is named "return-to-hold." Since resistors R1 308 and R2 310 are connected across the positive and negative outputs of the I-to-V converter, the mid-point of this resistor string (the terminals of switch S3 306) is set at the output common-mode (CM) voltage of the amplifier A1. Since the output current cells are connected to this point, amplifier A1 is acting as a CM buffer and holds their drains at the CM level, eliminating the need for an extra CM buffer.

During the "hold" period, DAC flip-flop output 412 is changed, but analog output 410 is unchanged since the feedback resistor R1 308 and R2 310 are still disconnected from the summing junctions SJP and SJN. When the "hold" period ends, S3 306 is turned off, S1 302 and S2 304 are turned on. Resistors R1 308 and R2 310 are connected back to SJP and SJN allowing the DAC current to be converted to the output voltage. Since the DAC flip-flop output 412 changes during the "hold" period, the output has no information or memory about the rise and fall time of each individual switching current cell. The output voltage then is free of inter-symbol interference.

Figure 5:
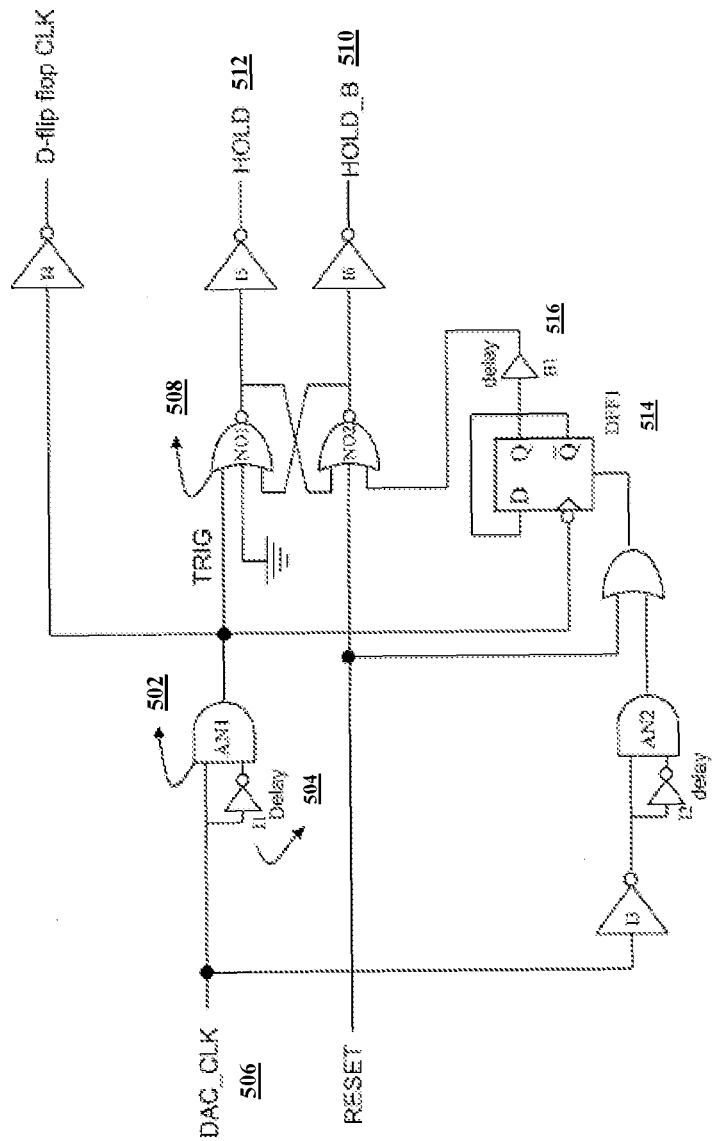
FIG. 5 illustrates a schematic diagram of a control logic for the return-to-hold signals.

A circuit that generates the HOLD, HOLD_B and clock 408 for the D-flip flops is shown in FIG. 5. A RESET signal is used to place the RS flip flop shown into the reset state where HOLD_B is HIGH and HOLD is LOW. The D-flip flop DFF1 is also cleared by the same RESET signal.

The logic gates AN1 502 and I1 504 create a pulse upon the arrival of the rising edge of DAC_CLK 506, where DAC_CLK 506 is the main clock of the converter. The duration of the created pulse is determined by the delay through inverter I1 504. Typically, a 1 ns to 2 ns pulse width is enough to set an RS flip flop found in today silicon technologies. When this pulse appears at the input of NO1 508, it sets HOLD_B 510 to LOW, and HOLD 512 to HIGH. At this time, the I-to-V is in the "hold" stage where its voltage remains constant. The falling edge of this pulse then clocks the flip flop DFF1 514 to produce a HIGH at the output Q. After a delay determined by B1 516, the output of B1 516 then goes HIGH and sets the HOLD_B 510 back to HIGH, and HOLD 512 back to LOW; also the I-to-V starts to convert the current produced by the new DAC code.

The falling edge of DAC_CLK then generates a pulse which in turn resets DFF1 514. The circuit of FIG. 5 repeats the same operation for every rising edge of DAC_CLK.

Since the falling edge of TRIG is used to clock the D-flip flop array which stores the DAC codes, the change of state in the D-flip flop array, which corresponds to the change of digital code to be converted, will take place when the I-to-V converter is in the "hold" mode. When the delay through inverter I1 and buffer B1 are approximately equal, the D-flip flop array state is guaranteed to change in the middle of the "hold" period. Having the I-to-V converter in the hold mode, i.e. maintaining an analog output associated with a conversion of a previous digital value, for the duration of the hold period when D flip-flop outputs change in response to the change of digital code to the next digital value, advantageously allows to not disturb the current source drain voltage during this critical transient time.

One advantage of the circuit of FIG. 5 is that logic gates can be easily designed to produce an optimal cross point for HOLD 512 and HOLD_B 510. This optimal cross point yields a minimum disturbance to the summing junctions of the amplifier which is essential for high speed operations. Further, with sufficient bandwidth in the amplifier, the switching scheme is insensitive to any variation in HOLD_B pulse width. This implies that the circuit is insensitive to the jitter introduced by the logic gates in FIG. 5, which is yet another advantage of the return-to-hold technique.

Basics of Three-Level DACs

Referring to FIG. 1 described above, one drawback of conventional thermometer-code current steering DACs is thermal noise performance. In particular, when data is zero, half of the switching current sources may be connected to one summing junction, and the other half may be connected to the other summing junction of the I-to-V converter. Moreover, the top current sources may be always connected to the summing junctions. The current sources are the dominant thermal noise source in the DAC output and dictate the signal to noise ratio (SNR) of the converter.

Figure 6:
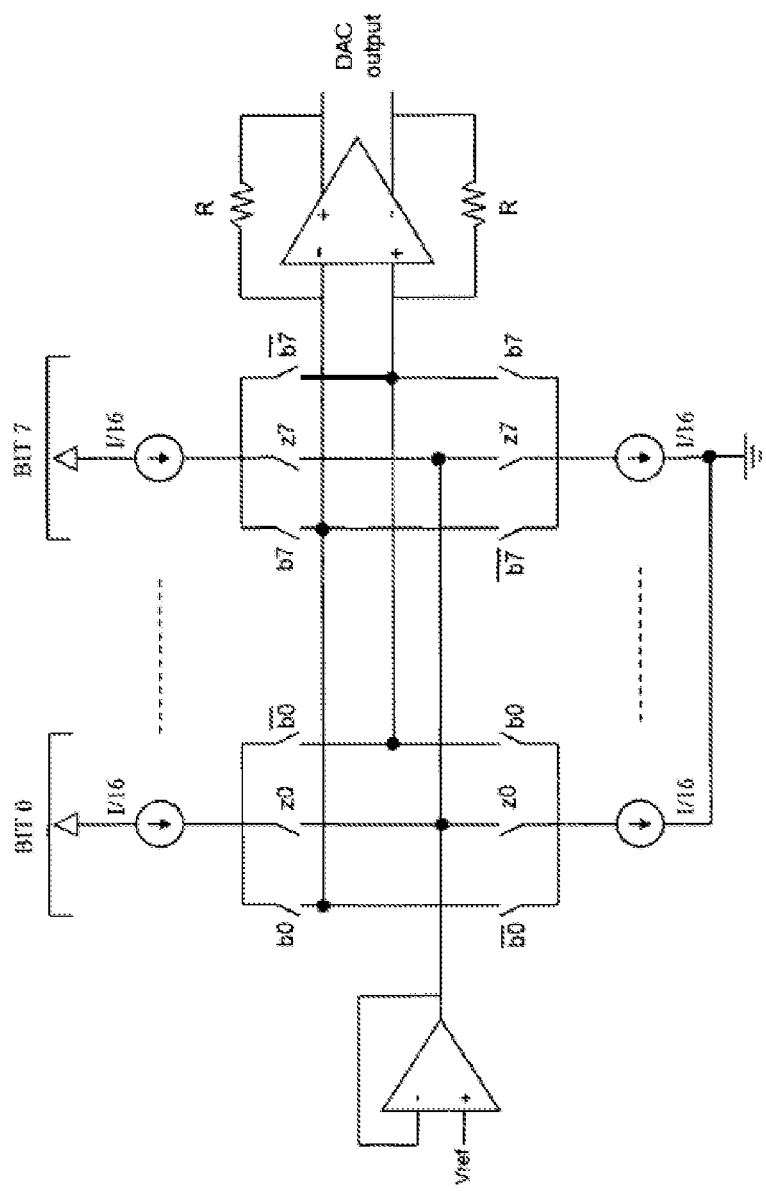
FIG. 6 illustrates a schematic diagram of an 8-bit, three-level logic thermometer code current steering DAC.
Figure 8:
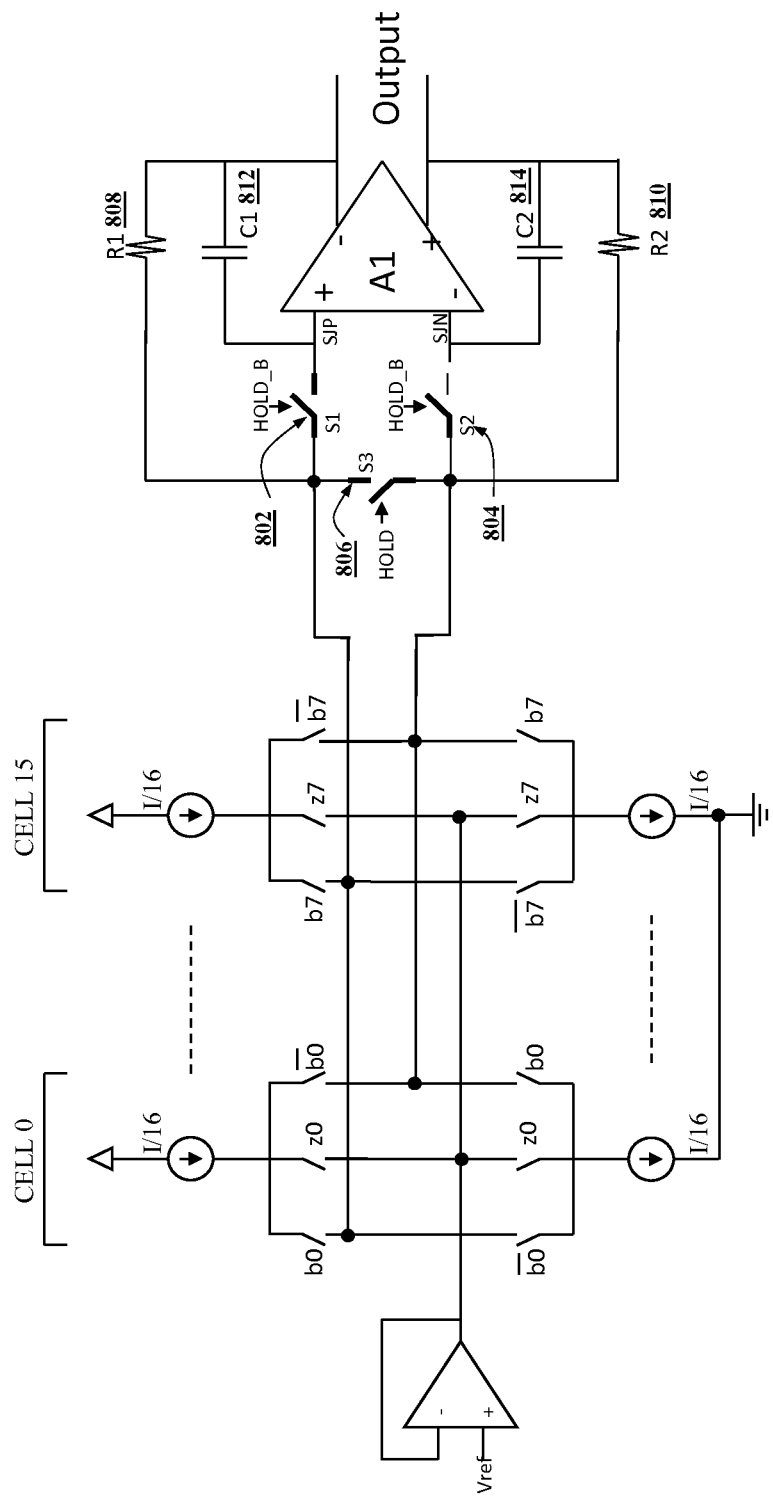
FIG. 8 illustrates a block diagram of a return-to-hold scheme for a 16-bit, three-level, thermometer code current steering DAC.

One technique previously used to overcome the above-discussed thermal noise problem is based on employing three-level thermometer code current steering DAC cells, each including a pair of current sources (positive and negative) and 3 switches per each current source, the switches referred to herein as switches b, b_bar, and z. Such DAC cells are shown in the example of FIG. 6, illustrating eight DAC cells denoted as bits 0-7. Typically, a DAC employs multiple DAC cells, e.g. 8 DAC cells in the example of FIG. 6 or 16 DAC cells in the example of FIG. 8, the switches of a particular DAC cells are denoted in the FIGUREs with reference numbers indicating the DAC cell, e.g. a switch "b" of a DAC cell indicated as "cell 0" in FIG. 8 or of a DAC cell indicated as "bit 0" as in FIG. 6 is shown as a switch b0, a switch "b" of a DAC cell indicated as "cell 15" in FIG. 8 is shown as a switch b15, and so on.

Since each pair of current sources may be connected to the summing junction in three different ways, each pair may contribute a positive quantity of charge, a negative quantity of charge, or nothing at all. When the data is zero, all the current sources are connected to a buffer amplifier to maintain their proper drain voltage. Thereby, the main noise source is from the amplifier, which by design is much smaller than that of the current sources. Hence, the SNR may be significantly improved. FIG. 7 shows a truth table for a control signal for the switch z as shown in FIG. 6.

For each DAC cell (e.g. each of the bits 0-7 shown in FIG. 6), when a digital value of 1 is converted, switch b is closed while switches b_bar and z are open; when a digital value of −1 is converted, switch b_bar is closed while switches b and z are open; and, when a digital value of 0 is converted, switch z is closed while switches b and b_bar are open.

Application of Return-to-Hold Switching Scheme to Three-Level DACs

Figure 9:
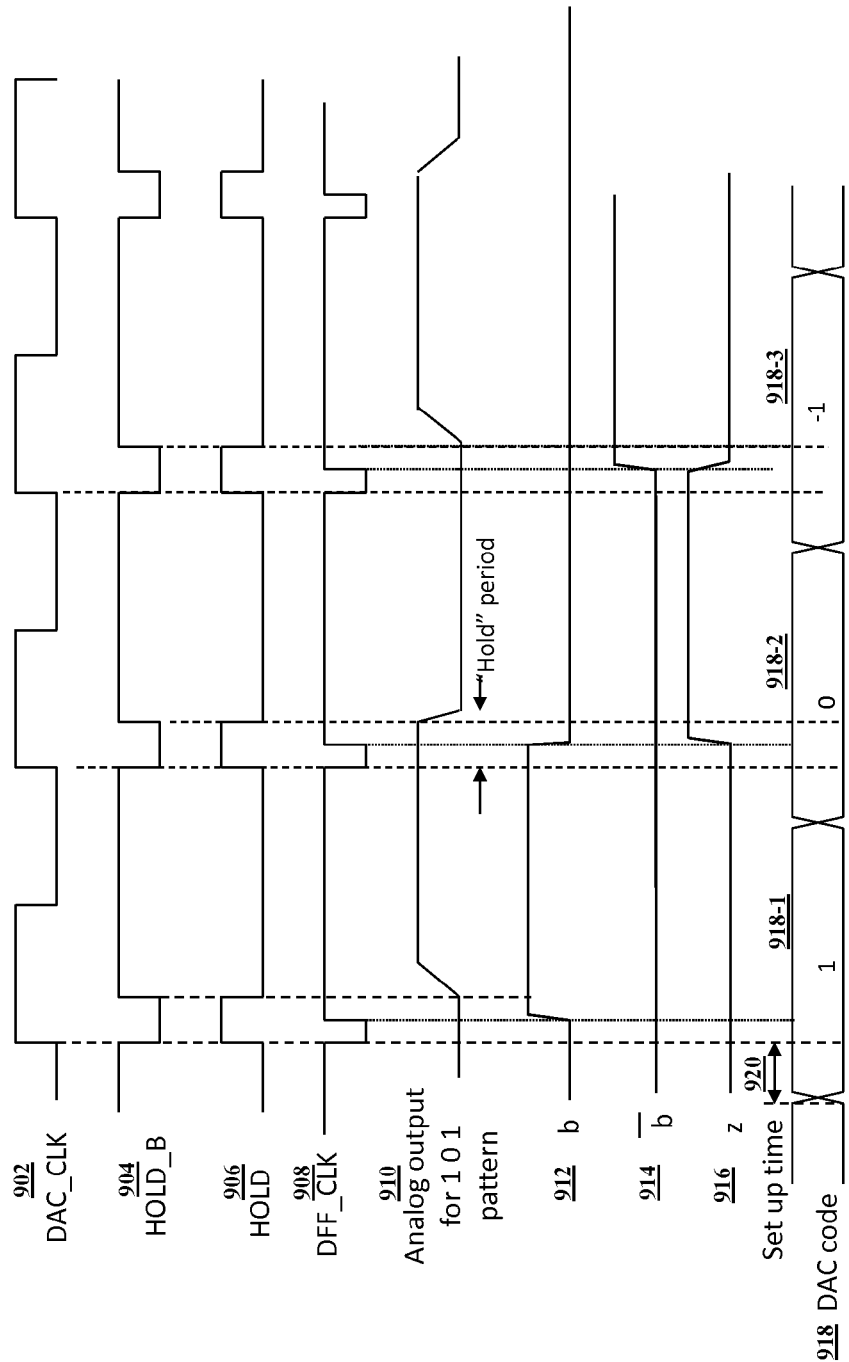
FIG. 9 illustrates a timing diagram of the return-to-hold scheme for a three-level DAC.

A return-to-hold technique as described above in context of conventional two-level DACs may be applied to three-level DACs as well, resulting in similar advantages for three-level DACs as were described for the two-level DACs. An example of such implementation is shown in FIG. 8, providing a block diagram of a return-to-hold scheme for a 16-bit, three-level, thermometer code current steering DAC. The return-to-hold scheme is implemented on a three-level DAC by the addition of switches S1 802, S2 804, and S3 806. Similar to the illustration of FIG. 3, in FIG. 8, switches S1 802 and S2 804 are controlled by a HOLD_B signal while switch S3 806 is controlled by a HOLD signal. The timing diagram of the clock, the current cell control bits and the control signals are shown in FIG. 9.

The operation of the RTH circuit shown in FIG. 8 may be described as follows. When the rising edge of the clock 902 arrives, HOLD_B 904 becomes LOW and disconnects the feedback resistors R1 808 and R2 810 from the summing junctions of the I-to-V converter by turning off switches S1 802 and S2 804. At the same time, HOLD 906 becomes HIGH and connects the left hand sides of the resistors R1 808 and R2 810 via switch S3 806. The outputs of the current cells are also short circuited together via switch S3 806. During this "hold" period, the I-to-V converter is in the "hold" mode, its output voltage is kept at the same value by the capacitors C1 812 and C2 814. Since resistors R1 808 and R2 810 are connected across the positive and negative outputs of the I-to-V converter, the mid-point of this resistor string (the terminals of switch S3 806) is set at the output common-mode (CM) voltage of the amplifier A1. Since the output current cells are connected to this point, amplifier A1 is acting as a CM buffer and holds their drains at the CM level, eliminating the need for an extra CM buffer.

For the circuit of FIG. 8, similar to the circuit of FIG. 3, during the "hold" period, DAC flip-flop output is changed in response to change of the DAC code. The change of flip-flop output is not expressly shown in FIG. 9, but it would be similar to the D-flip flop output changing as shown with output 412 in FIG. 412 (i.e. D-flip flop output changes during the hold period). What is shown in FIG. 9 is the change in DAC code 918, i.e. changing of the digital values. This change happens a little bit before the hold periods, with an offset that may be referred to as set-up time 920, which is a time it takes to set up the change in D-flip flop output in response to the change of the DAC code.

While, during the "hold" period, DAC flip-flop output is changed in response to change of the DAC code, analog output 910 is unchanged since the feedback resistor R1 808 and R2 810 are still disconnected from the summing junctions SJP and SJN. When the "hold" period ends, S3 806 is turned off, S1 802 and S2 804 are turned on. Resistors R1 808 and R2 810 are connected back to SJP and SJN allowing the DAC current to be converted to the output voltage. Since the DAC flip-flop output changes during the "hold" period, the output has no information or memory about the rise and fall time of each individual switching current cell and the output voltage is free of inter-symbol interference.

Similar to the operation of circuit shown in FIG. 6, for each DAC cell (e.g. each of the bits 0-15 shown in FIG. 8) of a three-level return-to-hold DAC, when a digital value of 1 is converted, switch b is closed while switches b_bar and z are open. This is illustrated in FIG. 9 with a control signal 912 for the switch b being in a HIGH state, while a control signal 914 for the switch b_bar and a control signal 916 for the switch z both being in a LOW state when a digital value of 1 (indicated in FIG. 9 with reference numeral 918-1) is converted.

Similarly, when a digital value of 0 is converted, switch z is closed while switches b and b_bar are open. This is illustrated in FIG. 9 with the control signal 916 for the switch z being in a HIGH state, while the control signal 914 for the switch b_bar and the control signal 912 for the switch b both being in a LOW state when a digital value of 0 (indicated in FIG. 9 with reference numeral 918-2) is converted.

Finally, when a digital value of −1 is converted, switch b_bar is closed while switches b and z are open. This is illustrated in FIG. 9 with the control signal 914 for the switch b_bar being in a HIGH state, while the control signal 912 for the switch b and the control signal 916 for the switch z both being in a LOW state when a digital value of −1 (indicated in FIG. 9 with reference numeral 918-3) is converted.

Figure 10:
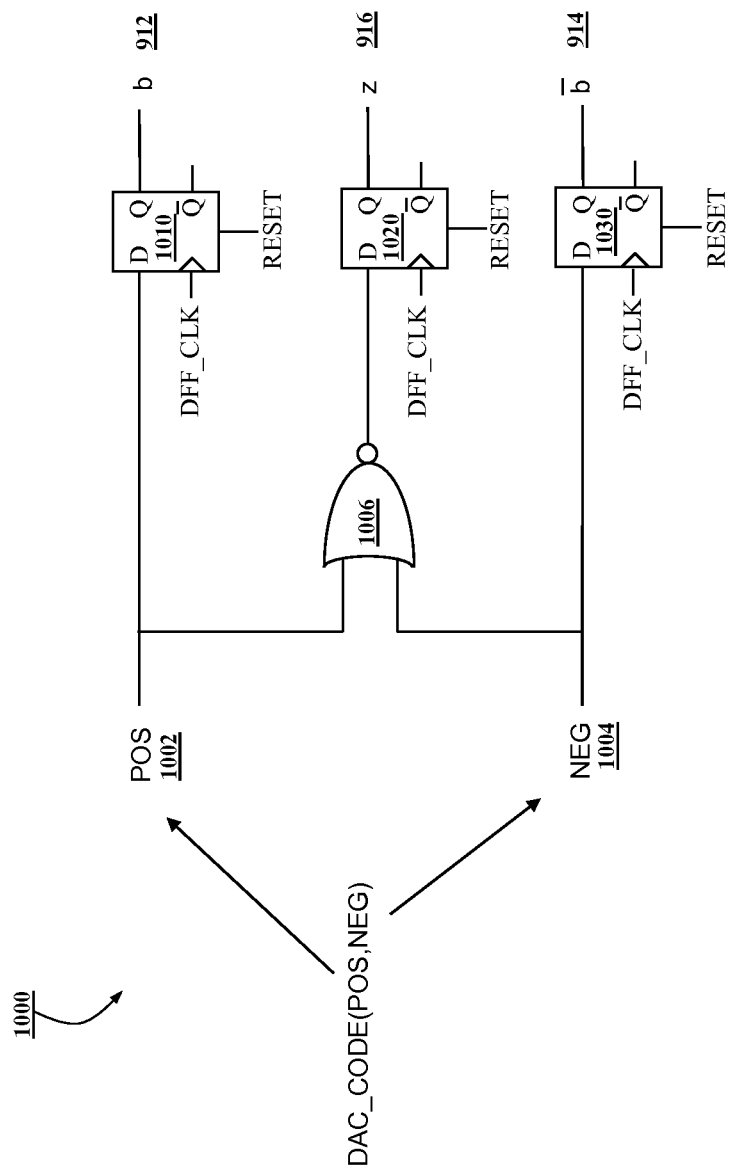
FIG. 10 illustrates a schematic diagram of control signal generation for a three-level DAC.

An exemplary circuit that could be used to generate the control signals 912, 914, and 916 for, respectively, b, b_bar, and z switches of a three-level RTH DAC for each DAC cell is shown as circuit 1000 in FIG. 10. As shown in FIG. 10, control signal 912 for the b switch is an output of a flip flop 1010, control signal 914 for the b_bar switch is an output of a flip flop 1030, and control signal 916 for the z switch is an output of a flip flop 1020. These control signals drive the switches to open and close as illustrated in FIG. 9.

When a digital value being converted is positive, it is provided to an input POS 1002. When a digital value being converted is negative, it is provided to an input NEG 1004 of the circuit 1000. When a digital value being converted is zero, which is the case when both input POS 1002 and NEG 1004 receive zeros, the output of NOR gate 1006 will become a logic HIGH. The positive and negative digital values and the NOR gate output are then provided to their respective flip flops 1010, 1030 and 1020, respectively.

The control signals 912, 914, and 916 are only making their transitions when the HOLD signal 906 is HIGH, at which time the I-to-V is in the "hold" stage where its voltage remains constant, ensuring that the switches are switched only during the hold periods. Other discussions provided above with reference to FIG. 5 are applicable here and, therefore, in the interests of brevity, are not repeated.

FIG. 10, as well as FIGS. 12, 14 and 16 described below, provide only some examples for the generation of the control signals for the b, b_bar, and z switches of DAC cells. In other embodiments, other circuit architectures could be used for generating these signals in accordance with the switching techniques described herein.

Such three-level RTH DACs combine advantages provided by the use of a RTH scheme and advantages provided by the use of three-level logic, described above.

Improved Switching Techniques for Three-Level RTH DACs

Embodiments of the present disclosure provide improved switching techniques for controlling three-level DAC cells employing a return-to-hold scheme. Disclosed techniques include switching a DAC cell off for at least the duration of a time period between two hold periods while a digital value of zero is being converted. Because the DAC cell is switched off between two hold periods, the current source drain voltage is not disturbed during the critical transient times when D flip-flop outputs change, which happens during the hold periods, in response to change of digital values to be converted. In this manner, power consumption may be reduced while preserving the high performance properties of a three-level return-to-hold DAC.

Embodiments of the present disclosure are based on recognition that a DAC cell converting a digital value of zero still consumes relatively significant amount of power by having the switch z closed and current flowing through that part, i.e. the path of the z switch, of the DAC cell because when the switch z is closed, the circuit is shunted and power flows through. Preventing the current from flowing through the DAC cell by switching such a DAC cell completely off, e.g. by switching the current source of that DAC cell off, at least during a time period between two consecutive hold periods when such a zero value is converted, allows reducing power consumption of the DAC cell. Thus, embodiments of the present disclosure take advantage of the idle period between two consecutive hold period in a RTH scheme applied to three-level DACs by completely turning off the current source of a DAC cell converting a zero digital value. Doing so does not disturb the current source drain voltage at the critical transient times, preserving the high performance property of the three-level RTH DACs.

The improved switching techniques will now be described with references to the timing and control signal diagrams of FIGS. 11-16, illustrating improved controlling mechanisms of a circuit architecture as shown in FIG. 8. Since all of these techniques relate to three-level DACs implementing return-to-hold scheme but the switching is modified, the DAC cells described below may be considered to implement a modified version of a return-to-hold scheme.

Improved Switching Technique #1

Figure 11:
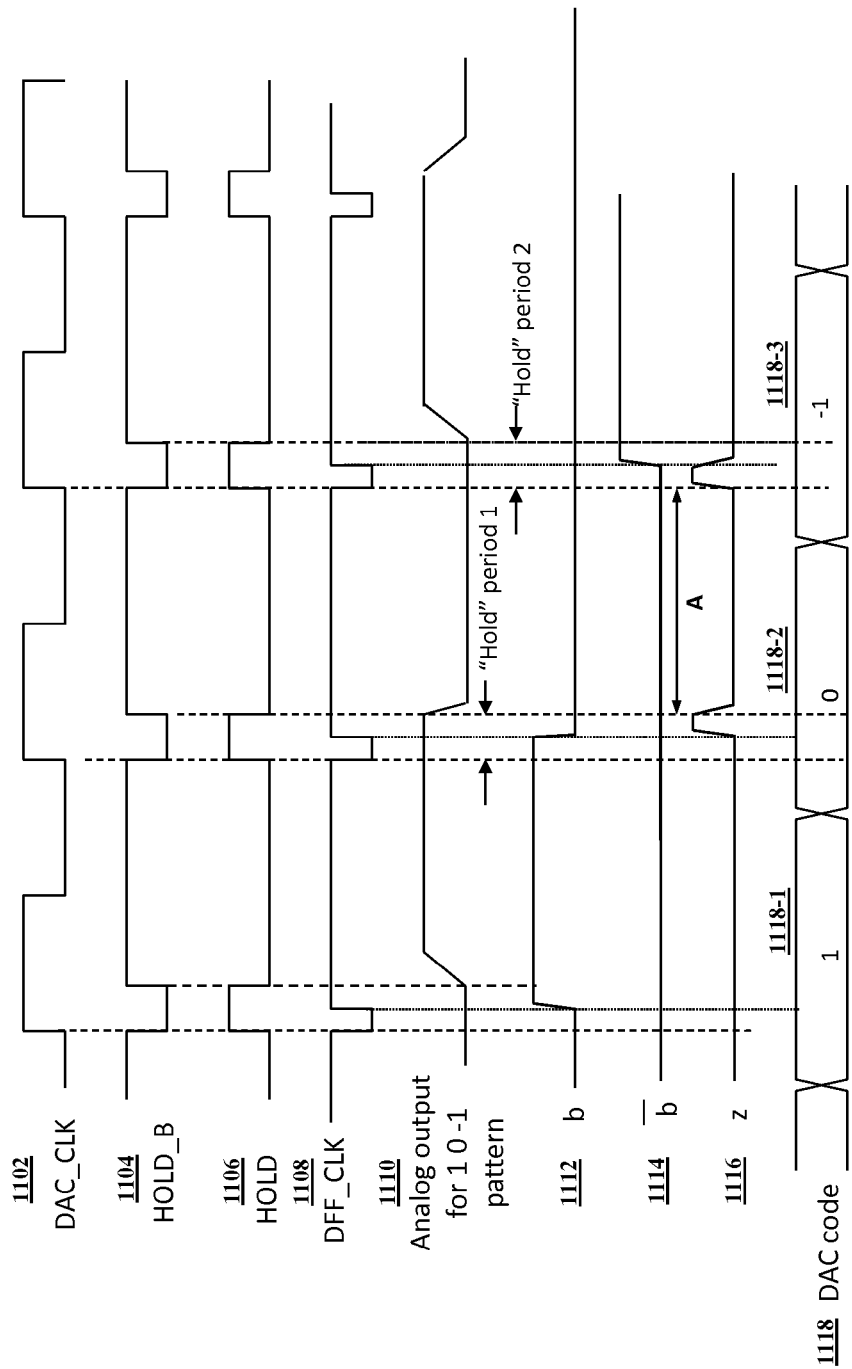
FIG. 11 illustrates a timing diagram of a first switching technique of a three-level DAC cell implementing modified return-to-hold scheme, according to some embodiments of the disclosure.

FIG. 11 illustrates a timing diagram of a first switching technique of a three-level DAC cell implementing modified return-to-hold scheme, according to some embodiments of the disclosure. Since the first switching technique is a modification of the return-to-hold technique described above, descriptions provided with reference to FIG. 9 are applicable here with certain modifications. In the interest of brevity, the entire descriptions of FIG. 9 are not repeated here. Rather, modifications to the switching mechanism of FIG. 9 will now be described.

Similar to FIG. 9, FIG. 11 illustrates DAC clock signal 1102, HOLD_B signal 1104, HOLD signal 1106, D-flip-flop clock 1108, and analog output 1110 for the exemplary DAC code shown in FIG. 11. Also similar to FIG. 9, FIG. 11 illustrates control signals 1112, 1114, and 1116 for switches b, b_bar, and z, respectively, as well as an exemplary portion of DAC code 1118 comprising digital values 1, 0, and −1 indicated with reference numerals 1118-1, 1118-2, and 1118-3, respectively.

The timing of various components illustrated in FIG. 11 is the same as of those shown in FIG. 9, except for the control signal controlling the switch z, shown as control signal z 1116. As shown in FIG. 11, according to the first switching technique, when a digital value of 0 is converted, switch z is open in between the two consecutive hold periods shown as hold period 1 and hold period 2, i.e. during a time period shown as time period A in FIG. 11. Otherwise control signals b, b_bar, and z are the same as in FIG. 9. In particular, in accordance with the first switching technique shown in FIG. 11, control signal for the z switch is HIGH during portions of the hold periods 1 and 2, as for the switching technique of FIG. 9, indicating that the z switch is closed at those times. These times need to be sufficiently long to achieve a desired settling behavior of the DAC cell's current source which depends on the desired DAC behavior, e.g. to achieve a certain level of distortion settlement, e.g. 96 dB of distortion settlement. If the z switch of the example of FIG. 11 remained closed in the time period between the hold periods 1 and 2 (i.e. in the time period A), resulting in the conventional return-to-hold scheme as illustrated in FIG. 9, it would give more time for the current source to settle, which would be beneficial, but would consume more power. Having the z switch open during the time period A, as in the example of FIG. 11, provides an acceptable compromise between achieving adequate DAC behavior while reducing power consumption.

Figure 12:
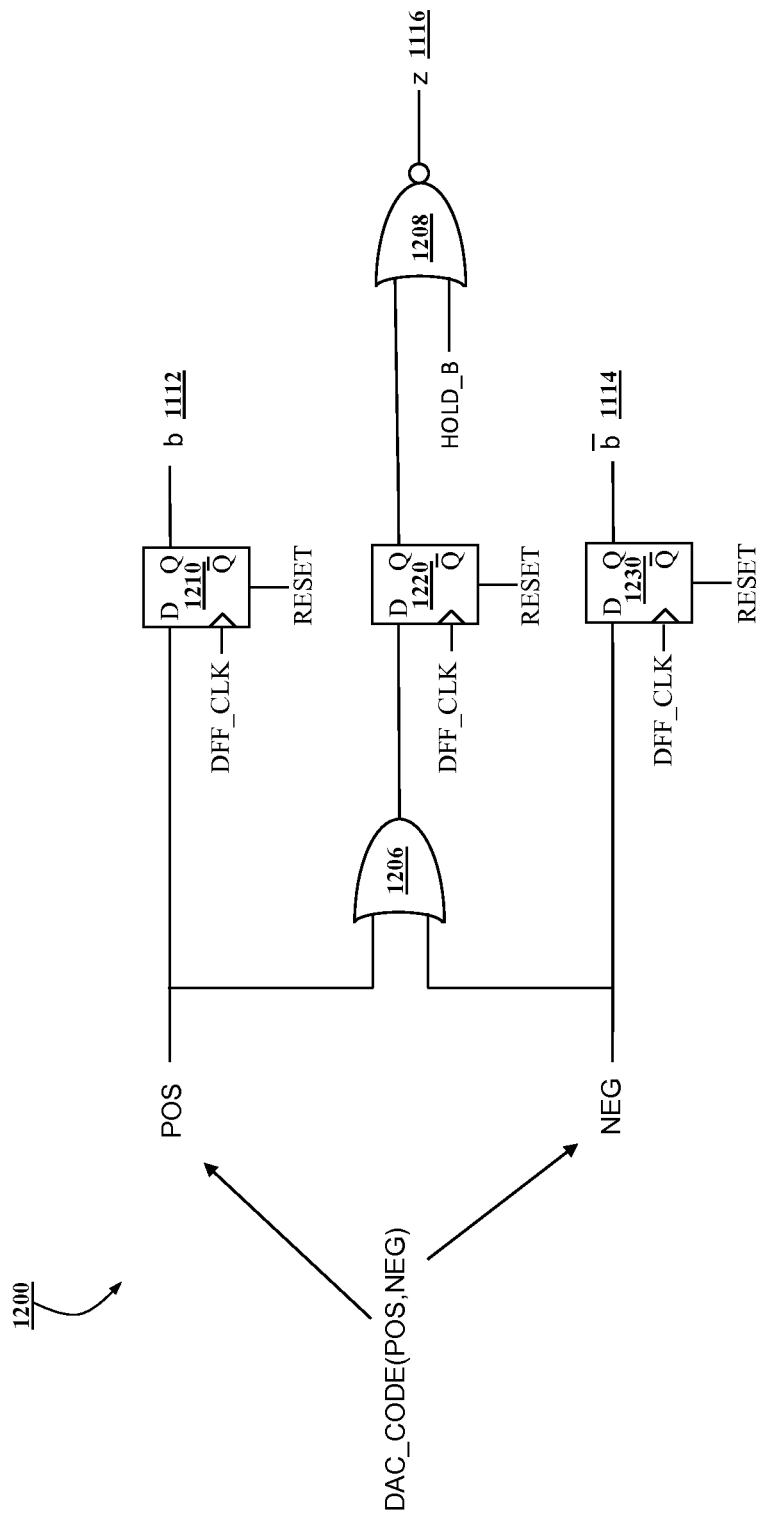
FIG. 12 illustrates a schematic diagram of control signal generation for implementing the first switching technique, according to some embodiments of the disclosure.

A circuit that may generate the control signals 1112, 1114, and 1116 shown in FIG. 11 is illustrated in FIG. 12 as circuit 1200. Thus, FIG. 12 illustrates a schematic diagram of control signal generation for implementing the first switching technique on a three-level RTH DAC cell as e.g. shown in FIG. 8. Of course, in other embodiments, other circuits for generating the control signals for the first switching technique may be employed.

Since the first switching technique is a modification of the return-to-hold technique described above, descriptions provided for the control logic illustrated in FIG. 10 are applicable here with certain modifications. Therefore, in the interest of brevity, the entire descriptions of FIG. 10 are not repeated here. Rather, modifications to the generation of control signals of FIG. 10 will now be described.

An exemplary circuit that could be used to generate the control signals 1112, 1114, and 1116 is shown as circuit 1200 in FIG. 12. As shown in FIG. 12, control signal 1112 for the b switch is an output of a flip flop 1210, control signal 1114 for the b_bar switch is an output of a flip flop 1230, and control signal 1116 for the z switch is an output of a NOR gate 1208. These control signals drive the switches to open and close as illustrated in FIG. 11.

FIG. 12 differs from FIG. 10 in the generation of a control signal for switch z, i.e. signal 1116. In particular, as shown in FIG. 12, the circuit 1200 employs an OR gate 1206 instead of the NOR gate 1006 of FIG. 10. Further, instead of providing the output of the element 1220 as the control signal for the switch z as was shown in FIG. 10, in FIG. 12, that output is provided to a NOR gate 1208, for which the second input is HOLD_B, to generate control signal 1116 for switch z. Other discussions provided above with reference to FIG. 10 are applicable here with modifications that would be apparent to a person of ordinary skill in the art based on the present disclosure and, therefore, are not repeated.

To summarize, according to the switching technique #1, when a digital value switched from a previous value to a next value that is zero, a DAC cell is first switched on to the dump node (i.e. switch z is closed and the current flows through the DAC cell). This action provides the set up time for the current source of the DAC cell if it is used in the next clock cycle. It also provides the transient time out of the cycle when the DAC cell is used. The DAC cell is then turned off by HOLD_B for the time period A. During the "power save" period A, the DAC cell is off completely, reducing power consumption.

Switching technique #1 relates to improved switching when a single digital value of zero is being converted. This technique may be applied each time a zero digital value is converted.

In some implementations, DAC codes may be such that they contain a number of consecutive zero digital values. In such cases, switching technique #1 could be extended to advantageously account for this. Embodiments covering such situations will now be described with reference to improved switching techniques #2 and #3.

Improved Switching Technique #2

Figure 13:
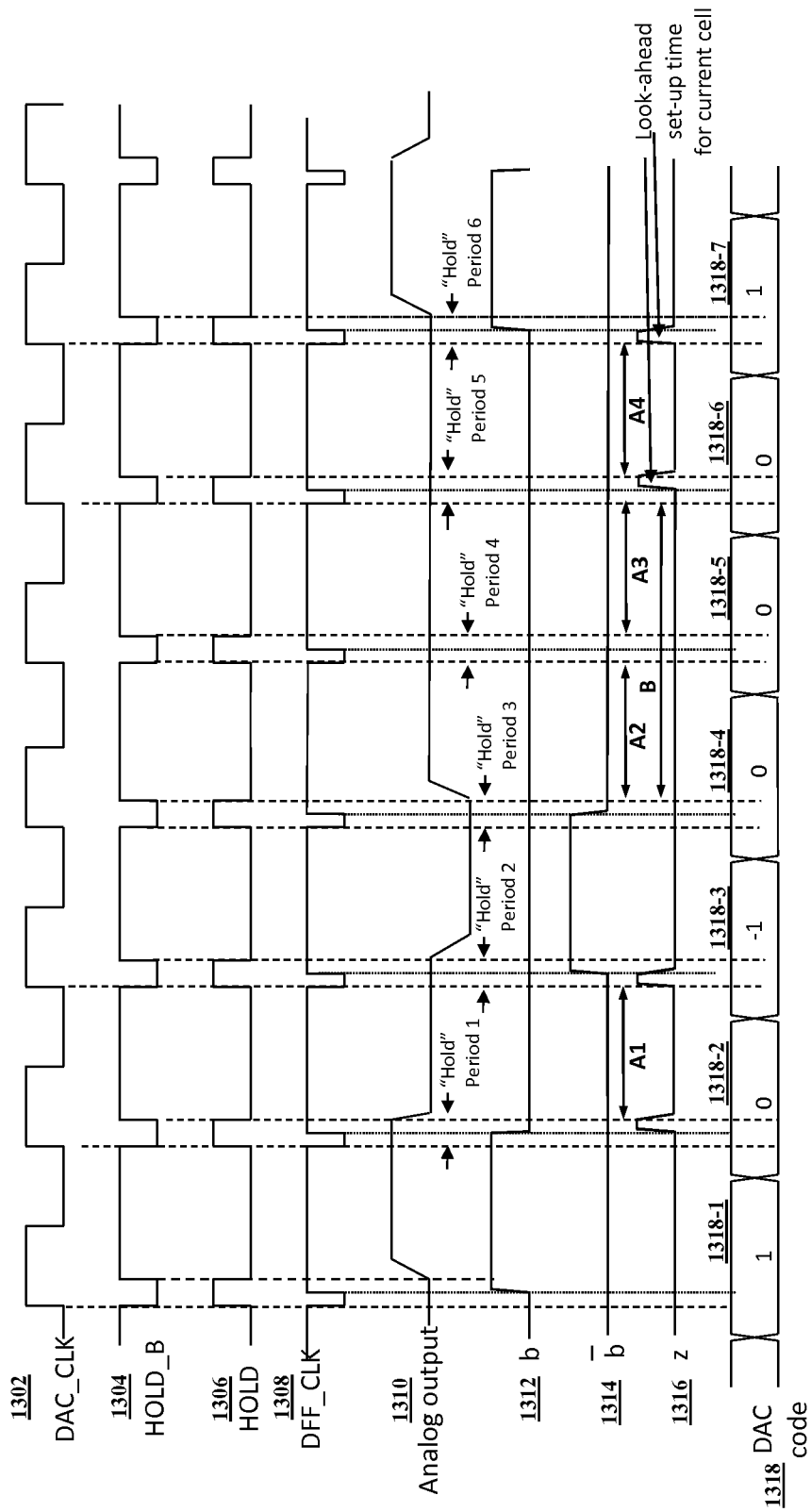
FIG. 13 illustrates a timing diagram of a second switching technique of a three-level DAC cell implementing modified return-to-hold scheme, according to some embodiments of the disclosure.

FIG. 13 illustrates a timing diagram of a second switching technique of a three-level DAC cell implementing modified return-to-hold scheme, according to some embodiments of the disclosure. Since the second switching technique is a modification of the return-to-hold technique described above with reference to FIG. 9 and is an extension to the switching technique #1 described above with reference to FIG. 11, descriptions provided with reference to FIGS. 9 and 11 are applicable here with certain modifications. Therefore, only the modifications to the switching mechanisms described above will now be described for the switching technique #2.

Similar to FIGS. 9 and 11, FIG. 13 illustrates DAC clock signal 1302, HOLD_B signal 1304, HOLD signal 1306, D-flip-flop clock 1308, and analog output 1310 for the exemplary DAC code shown in FIG. 13. Also similar to FIGS. 9 and 11, FIG. 13 illustrates control signals 1312, 1314, and 1316 for switches b, b_bar, and z, respectively, as well as an exemplary portion of DAC code 1318, which, this time, includes a series of digital values comprising values 1, 0, −1, 0, 0, 0, and 1 indicated with reference numerals 1318-1 through 1318-7, respectively.

The timing of various components illustrated in FIG. 13 for various digital code values is the same as of those shown in FIG. 9, except for the control signal controlling the switch z, shown as control signal z 1316. As shown in FIG. 13, according to the second switching technique, first it is determined that a sequence of a plurality k of consecutive zeros will need to be converted. Such a sequence of k consecutive zeros is shown in the example of FIG. 13 with a sequence of three consecutive zeros (i.e. k=3) shown as digital values 1318-4, 1318-5, and 1318-6. In such a case, switch z may be kept open for the duration of a continuous time period (time period B in FIG. 13) between the end of a hold period (in FIG. 13—hold period 3) associated with the change of a non-zero digital value (in FIG. 13—DAC code value 1318-3) to the first zero value (in FIG. 13—DAC code value 1318-4) of the sequence of k zeros to the beginning of a hold period (in FIG. 13—hold period 5) associated with a change of a $(k-1)_{th}$ digital value (in FIG. 13—DAC code value 1318-5) to a $k_{th}$ digital value (in FIG. 13—DAC code value 1318-6) of the k consecutive zero digital values.

Thus, switching technique #2 keeps the DAC cell switched off for the time period as provided by the switching technique#1, see e.g. two instances of the time period A in FIG. 13 shown as time periods A2 and A3, but, because a plurality of consecutive zero values are being converted, it is possible that the time when the DAC cell is switched off may be longer than compared with only implementing the switching technique #1. This would be the case for k equal to or greater than 3, where time period B would include (k−1) time periods A within, as shown in FIG. 13 with time period B including time periods A2 and A3.

The k consecutive digital values may be evaluated using sample delay and look-ahead techniques as known in the art. The measures described above for the first (k−1) values of k zero values may then be applied. Sample delay and look-ahead may be performed continuously in a sense that as each next digital value is being converted, the sequence of k digital values being evaluate to determine if all values are zeros moves one digital value further. Thus, known sample delay and look-ahead techniques may be employed to continuously evaluate a sliding window of a predefined plurality of digital values and switching technique #2 may be applied continuously to a sequence of first (k−1) digital values of the k zero values.

Once it is determined that the next value following the k zero values is a non-zero value, switching technique #2 may further include power saving measures taken for the last zero value of this sequence. Note that in order to determine that the next value following the k zero values is a non-zero value, (k+1) values need to be evaluated using the known look-ahead techniques referred to above.

When a particular digital value is determined to be the last of the sequence of k zero digital values, as is e.g. the case for the digital value 1318-6 shown in FIG. 13, switching technique #2 may implement technique #1 for the conversion of that value—i.e. switch the DAC cell on to conduct current during the part of the hold period (in FIG. 13—hold period 5) associated with the change of $(k-1)_{th}$ digital value to $k_{th}$ digital value and then switch the DAC cell off again during the time period (in FIG. 13—time period A4) from the end of that hold period to the beginning of the next hold period (in FIG. 13—hold period 6). The DAC cell may then be switched on again during the latter hold period (i.e. switched on during hold period 6 in FIG. 13, as it would be in the RTH scheme of FIG. 9). Switching the DAC cell on in this manner for the conversion of the last digital value of zero allows preparing the circuit to the non-zero value coming up next by allowing the current sources to settle. This is indicated in FIG. 13 as "look-ahead set-up time for the current cell." The look-ahead set-up times shown in FIG. 13 are preferably selected to be sufficiently long to achieve a desired settling behavior of the DAC cell's current source which depends on the desired DAC behavior, e.g. to achieve a certain level of distortion settlement.

Alternatively, the DAC cell could be kept off for the duration between the outer hold periods of all k digital values, but that would result in decreased spurious-free dynamic range (SFDR) because the current source of the DAC cell would not have enough time to settle. Such a scenario is not specifically indicated in FIG. 13, but it would be keeping the DAC cell off between the hold period 3 and hold period 6. As is well-known, SFDR represents the strength ratio of the fundamental signal to the strongest spurious signal in the output and is considered an important characteristic of DAC performance, with higher SFDR being desirable. In this scenario, despite the decreased SFDR, the scenario may still be acceptable because it would result in greater power savings than that described above because the DAC cell can be kept off during the hold period associated with the change of $(k-1)_{th}$ digital value to $k_{th}$ digital value (i.e. hold period 5 in FIG. 13).

If, when switching technique #2 is implemented, it is determined that a plurality of digital values to be converted comprises a zero value surrounded by two non-zero digital values, then, in various embodiments, either switching technique #1 may be employed to save power during the conversion of this zero value (shown in FIG. 13 with the switch z being open during the time period A1) or no power saving techniques may be applied and switch z may remain closed through the conversion of that value (not shown in FIG. 13).

Figure 14:
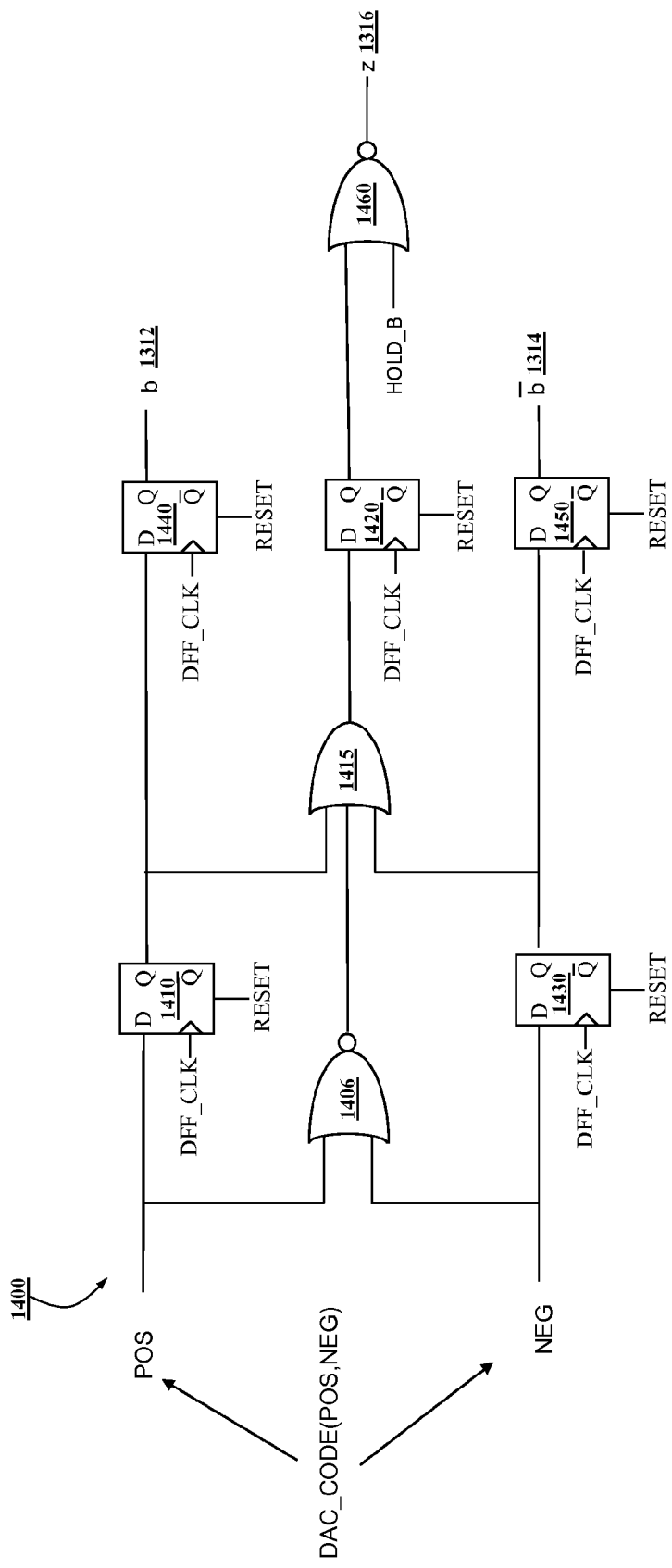
FIG. 14 illustrates a schematic diagram of control signal generation for implementing the second switching technique, according to some embodiments of the disclosure.

A circuit that may generate the control signals 1312, 1314, and 1316 shown in FIG. 13 is illustrated in FIG. 14 as circuit 1400. Thus, FIG. 14 illustrates a schematic diagram of control signal generation for implementing the second switching technique on a three-level RTH DAC cell as e.g. shown in FIG. 8. Of course, in other embodiments, other circuits for generating the control signals for the second switching technique may be employed.

Since the first switching technique is a modification of the return-to-hold technique described above, descriptions provided for the control logic illustrated in FIG. 10 are applicable here with certain modifications. Therefore, in the interest of brevity, the entire descriptions of FIG. 10 are not repeated here. Rather, modifications to the generation of control signals of FIG. 10 will now be described.

An exemplary circuit that could be used to generate the control signals 1312, 1314, and 1316 is shown as circuit 1400 in FIG. 14. As shown in FIG. 14, control signal 1312 for the b switch is an output of a flip flop 1440, control signal 1314 for the b_bar switch is an output of a flip flop 1450, and control signal 1316 for the z switch is an output of a NOR gate 1460. These control signals drive the switches to open and close as illustrated in FIG. 13.

FIG. 14 differs from FIG. 10 in the generation of a control signal for switch z. In particular, as shown in FIG. 14, the input data is delayed by the flops 1410 and 1430, which facilitates the look ahead action as described in the timing diagram of FIG. 13. Other discussions provided above with reference to FIGS. 10 and 12 are applicable here with modifications that would be apparent to a person of ordinary skill in the art based on the present disclosure and, therefore, are not repeated.

To summarize, according to some embodiments of the switching technique #2, input data may be delayed by at least 1 clock cycle to allow for look ahead set-up time. When two or more consecutive zeros are detected in the incoming digital values, the DAC cell may be completely turned off, which may result in increased power savings due to less transients of the current cell. During the "power save" period B, the DAC cell is off completely, reducing power consumption. In some embodiments, if the next digital value is not a zero value, the DAC cell may be configured to apply switching technique #1.

Improved Switching Technique #3

Figure 15:
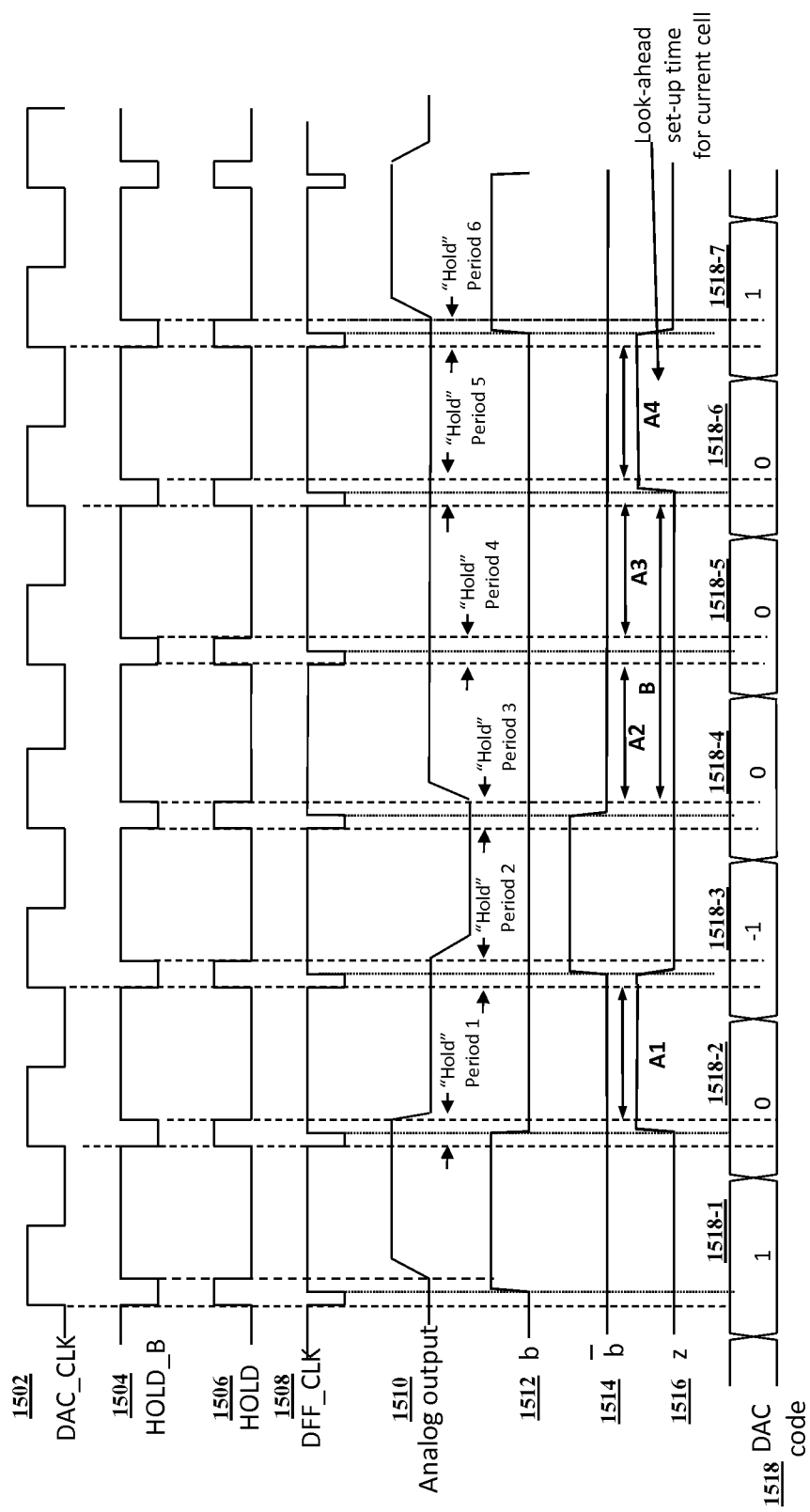
FIG. 15 illustrates a timing diagram of a third switching technique of a three-level DAC cell implementing modified return-to-hold scheme, according to some embodiments of the disclosure.

FIG. 15 illustrates a timing diagram of a third switching technique of a three-level DAC cell implementing modified return-to-hold scheme, according to some embodiments of the disclosure. Third technique differs from the embodiment of the second technique described above in how the last zero value of a sequence of k consecutive zero digital values is handled when the next value, i.e. $(k+1)_{th}$ value, is a non-zero value. In particular, as shown in FIG. 15, according to the switching technique #3, the z switch may be closed and the DAC cell may be configured to be switched on and conduct current for the duration of period A4.

Thus, according to switching technique #3, the DAC cell may be switched on to conduct current during the part of the hold period (in FIG. 15—hold period 5) associated with the change of $(k-1)_{th}$ digital value to $k_{th}$ digital value, be kept switched on during the subsequent time period (in FIG. 15—time period A4) from the end of that hold period to the beginning of the next hold period (in FIG. 15—hold period 6), and be kept switched on during the latter hold period (i.e. continue to be on in at least a portion of the hold period 6 in FIG. 15, as it would be in the RTH scheme of FIG. 9). Switching the DAC cell on in this manner for the conversion of the last digital value of zero provides more time, compared to the scenario shown in FIG. 13, to achieve the desired settling behavior of the current source in preparation to converting the non-zero value coming up next. This is indicated in FIG. 15 as "look-ahead set-up time for the current cell." Because this set-up time is greater in the scenario of FIG. 15 than that in FIG. 13, better SFDR may be achieved, although at the cost of consuming more power.

The rest of the description provided above with reference to FIG. 13 is applicable here and, therefore, in the interests of brevity, is not repeated here.

Figure 16:
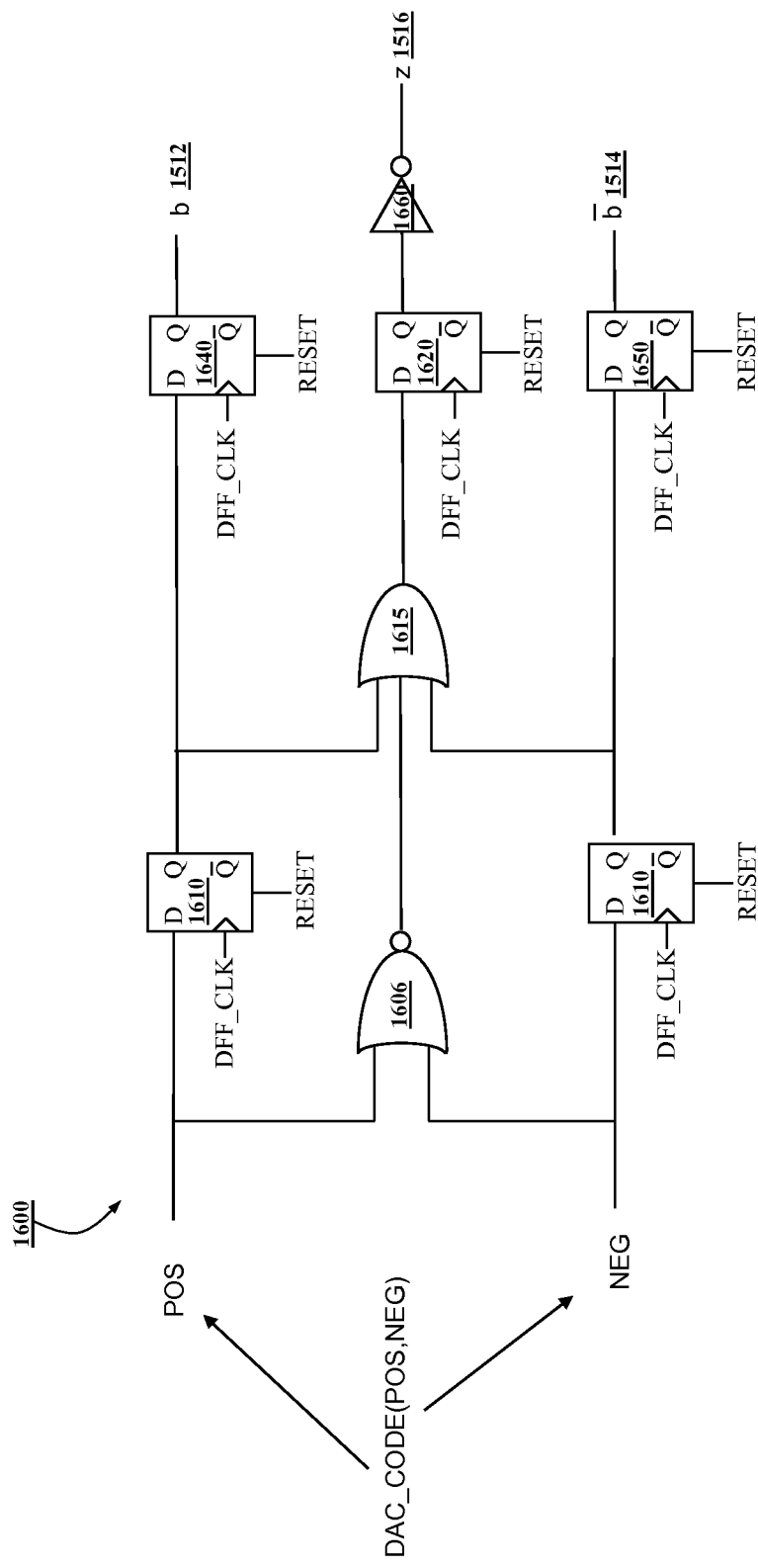
FIG. 16 illustrates a schematic diagram of control signal generation for implementing the third switching technique, according to some embodiments of the disclosure.

An exemplary circuit that could be used to generate the control signals 1512, 1514, and 1516 is shown as circuit 1600 in FIG. 16. As shown in FIG. 16, control signal 1512 for the b switch is an output of a flip flop 1210, control signal 1114 for the b_bar switch is an output of a flip flop 1230, and control signal 1116 for the z switch is an output of a NOR gate 1208. These control signals drive the switches to open and close as illustrated in FIG. 11. Again, FIG. 16 differs from FIGS. 10, 12, and 14 in the generation of a control signal for switch z. In particular, the NOR gate 1460 of FIG. 14 is replaced by an inverter 1660 shown in FIG. 16. This replacement allows the "z" to be HIGH for the full period prior to a non-zero conversions, i.e. conversions of digital input values which are either +1 or −1. This change allows a full period of set up time for the current sources in a DAC cell, as described previously. Other discussions provided above with reference to FIGS. 10, 12, and 14 are applicable here with modifications that would be apparent to a person of ordinary skill in the art based on the present disclosure and, therefore, are not repeated.

To summarize, according to some embodiments of the switching technique #3, input data may be delayed by at least 1 clock cycle to allow for look ahead set-up time. When two or more consecutive zeros are detected in the incoming digital values, the DAC cell may be completely turned off, which may result in increased power savings due to less transients of the current cell. During the "power save" period B, the DAC cell is off completely, reducing power consumption. In some embodiments, if the next digital value is not a zero value, the DAC cell may be configured to be kept on to allow for a full clock cycle of set-up time for the current source. Such an implementation may be particularly suitable for higher speed operation because it eliminates the need to charge and discharge drain parasitic capacitances.

Simulations of the switching techniques as illustrated in FIGS. 11, 13, and 15 have shown that progressively increased SFDR may be achieved, e.g. 90 dB for the scenario of FIG. 11, 95 dB for the scenario of FIGS. 13, and 100 dB for the scenario of FIG. 15.

Exemplary DAC

Figure 17:
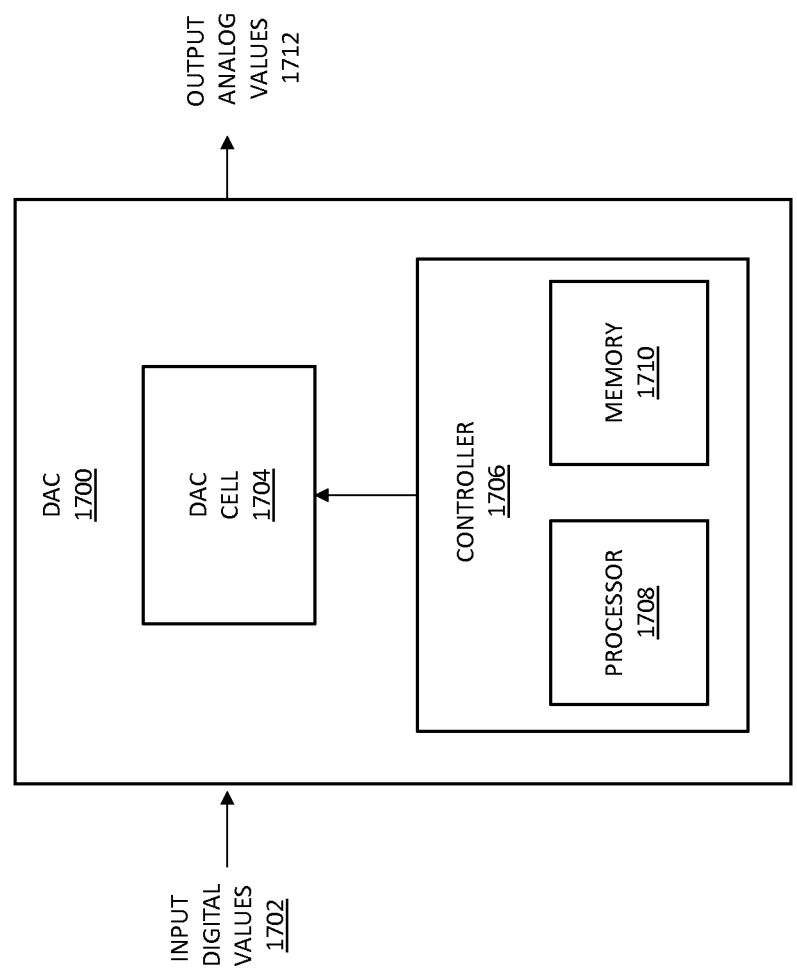
FIG. 17 illustrates a system view of an exemplary apparatus configured to implement improved switching techniques of a three-level DAC cell implementing modified return-to-hold scheme, according to some embodiments of the disclosure.

FIG. 17 illustrates a system view of an exemplary apparatus 1700, e.g. a DAC, configured to implement improved switching techniques of a three-level DAC cell implementing modified return-to-hold scheme, according to some embodiments of the disclosure. As shown, such an apparatus is configured to receive input digital values and provide at least some digital values to a DAC cell 1704. Although only one DAC cell is shown in FIG. 17, typically the DAC 1700 would include a plurality of such DAC cells, as illustrated in some of the FIGUREs above. The DAC 1700 may further include a controller 1706 configured to at least generate the control signals in the manner described above to allow or prevent current flowing through the DAC cell at different times, in accordance with the improved switching techniques described herein. To that end, in some embodiments, the controller 1706 may include at least a processor 1708 and a memory 1710, as shown in FIG. 17, configured to implement various improved switching techniques described herein. In other embodiments, however, the controller 1706 may be implemented to carry out the various improved switching techniques described herein by implementing circuits such as e.g. those shown in FIGS. 12, 14, and 16, or analogous circuit configured to generate the control signals for the b, b_bar, and z switches as described herein. Analog values 1712 may then be provided at the output of the DAC 1700.

In various embodiments, each DAC cell may be associated with a respective individual controller 1706. In other embodiments, the controller 1706 may be configured to control two or more, possibly all, DAC cells of a DAC.

Furthermore, while FIG. 17 illustrates the controller 1706 to be included within the DAC 1700, in other embodiments, the controller 1706 may be implemented external to the DAC 1700, in which case the controller 1706 may be configured to control the DAC 1700 remotely, via any appropriate communication channel. In other words, instead of being implemented within the DAC 1700 as shown in FIG. 17, the controller 1706 may be external to the DAC 1700 and be communicatively coupled to the DAC 1700.

Exemplary Data Processing System

FIG. 18 depicts a block diagram illustrating an exemplary data processing system 1800, according to one embodiment of the present disclosure. Such a data processing system could be configured to e.g. function as the controller 1706 described herein or as any other system configured to implement various improved switching techniques described herein.

As shown in FIG. 18, the data processing system 1800 may include at least one processor 1802 coupled to memory elements 1804 through a system bus 1806. As such, the data processing system may store program code within memory elements 1804. Further, the processor 1802 may execute the program code accessed from the memory elements 1804 via a system bus 1806. In one aspect, the data processing system may be implemented as a computer that is suitable for storing and/or executing program code. It should be appreciated, however, that the data processing system 1800 may be implemented in the form of any system including a processor and a memory that is capable of performing the functions described within this specification.

The memory elements 1804 may include one or more physical memory devices such as, for example, local memory 1808 and one or more bulk storage devices 1810. The local memory may refer to random access memory or other non-persistent memory device(s) generally used during actual execution of the program code. A bulk storage device may be implemented as a hard drive or other persistent data storage device. The processing system 1800 may also include one or more cache memories (not shown) that provide temporary storage of at least some program code in order to reduce the number of times program code must be retrieved from the bulk storage device 1810 during execution.

Input/output (I/O) devices depicted as an input device 1812 and an output device 1814, optionally, can be coupled to the data processing system. Examples of input devices may include, but are not limited to, a keyboard, a pointing device such as a mouse, or the like. Examples of output devices may include, but are not limited to, a monitor or a display, speakers, or the like. Input and/or output devices may be coupled to the data processing system either directly or through intervening I/O controllers.

In an embodiment, the input and the output devices may be implemented as a combined input/output device (illustrated in FIG. 18 with a dashed line surrounding the input device 1812 and the output device 1814). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 1816 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1800, and a data transmitter for transmitting data from the data processing system 1800 to said systems, devices and/or networks. Modems, cable modems, and Ethernet cards are examples of different types of network adapter that may be used with the data processing system 1800.

As pictured in FIG. 18, the memory elements 1804 may store an application 1818. In various embodiments, the application 1818 may be stored in the local memory 1808, the one or more bulk storage devices 1810, or apart from the local memory and the bulk storage devices. It should be appreciated that the data processing system 1800 may further execute an operating system (not shown in FIG. 18) that can facilitate execution of the application 1818. The application 1818, being implemented in the form of executable program code, can be executed by the data processing system 1800, e.g., by the processor 1802. Responsive to executing the application, the data processing system 1800 may be configured to perform one or more operations or method steps described herein.

Variations and Implementations

While embodiments of the present disclosure were described above with references to exemplary implementations as shown in FIGS. 1-18, a person skilled in the art will realize that the various teachings described above are applicable to a large variety of other implementations. For example, while some descriptions provided in the present disclosure refer to thermometer coding, these descriptions are equally applicable to other coding methods used in DACs. Further, while examples provided herein are described with reference to a DAC comprising 8 or 16 DAC cells, of course in other implementations any other number of DAC cells could be used.

Embodiments of the present disclosure may be particularly advantageous for oversampling, or interpolating, DACs, such as e.g. sigma-delta DACs, because of their high speed. However, the techniques presented herein are not limited to oversampling DACs as they are equally applicable, possibly with modifications that would be apparent to a person of ordinary skill in the art, to other types of DACs, such as e.g. Nyquist DACs.

In certain contexts, the features discussed herein can be applicable to automotive systems, safety-critical industrial applications, medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions.

In the discussions of the embodiments above, components of a system, such as e.g. clocks, multiplexers, buffers, and/or other components can readily be replaced, substituted, or otherwise modified in order to accommodate particular circuitry needs. Moreover, it should be noted that the use of complementary electronic devices, hardware, software, etc.

offer an equally viable option for implementing the teachings of the present disclosure related to improved switching techniques.

Parts of various systems for implementing improved switching techniques as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer readable storage medium.

In one example embodiment, any number of electrical circuits of FIGS. 8-18 may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of FIGS. 8-18 may be implemented as stand-alone modules (e.g., a device with associated components and circuitry configured to perform a specific application or function) or implemented as plug-in modules into application specific hardware of electronic devices. Note that particular embodiments of the present disclosure implementing improved switching techniques may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of improved switching techniques proposed herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of FIGS. 8-18 may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of FIGS. 8-18 and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the improved switching techniques as proposed herein illustrate only some of the possible functions that may be executed by, or within, system illustrated in FIGS. 8-18. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Although the claims are presented in single dependency format in the style used before the USPTO, it should be understood that any claim can depend on and be combined with any preceding claim of the same type unless that is clearly technically infeasible.

Note that all optional features of the apparatus described above may also be implemented with respect to the method or process described herein and specifics in the examples may be used anywhere in one or more embodiments.

What is claimed is:

1. A digital-to-analog converter (DAC) comprising:
    a plurality of DAC cells, each DAC cell comprising a three-level current steering DAC cell configured to maintain an analog output associated with a conversion of each digital value provided to the DAC cell to a next digital value for a hold period associated with the each digital value changing to the next digital value; and
    one or more controllers for controlling the plurality of DAC cells,
    wherein the one or more controllers are configured to, for each DAC cell of the plurality of DAC cells,
        determine that a first digital value provided to the DAC cell changes to a second digital value, the second digital value being zero,
        identify that the second digital value is the first zero value of k consecutive zero digital values, k being an integer equal to or greater than two, and
        prevent the DAC cell from conducting current at least during a time period between the end of a hold period associated with the change of the first digital value to the second digital value and the beginning of a hold period associated with a change of a digital value that is one before last of the k consecutive zero digital values to a digital value that is the last digital value of the k consecutive zero digital values.

2. The DAC according to claim 1, wherein the one or more controllers are further configured to, for the each DAC cell of the plurality of DAC cells,
    identify that a digital value immediately following the last digital value of the k consecutive zero digital values is a non-zero value,
    allow the DAC cell to conduct current during at least a portion of the hold period associated with the change of the digital value that is one before last of the k consecutive zero digital values to the last digital value of the k consecutive zero digital values, and
    prevent the DAC cell from conducting current during a time period between the end of the hold period associated with the change of the digital value that is one before last of the k consecutive zero digital values to the last digital value of the k consecutive zero digital values and the beginning of a hold period associated with a change of the last digital value of the k consecutive zero digital values to the digital value immediately following the last digital value of the k consecutive zero digital values.

3. The DAC according to claim 1, wherein the one or more controllers are further configured to, for the each DAC cell of the plurality of DAC cells,
    identify that a digital value immediately following the last digital value of the k consecutive zero digital values is a non-zero value,
    allow the DAC cell to conduct current during at least a portion of the hold period associated with the change of the digital value that is one before last of the k consecutive zero digital values to the last digital value of the k consecutive zero digital values, and
    allow the DAC cell to conduct current during a time period between the end of the hold period associated with the change of the digital value that is one before last of the k consecutive zero digital values to the last digital value of the k consecutive zero digital values and the beginning of a hold period associated with a change of the last digital value of the k consecutive zero digital values to the digital value immediately following the last digital value of the k consecutive zero digital values.

4. The DAC according to claim 1, wherein the one or more controllers being configured to prevent the DAC cell from conducting current comprises:
    the one or more controllers being configured to prevent the DAC cell from conducting current during a time period between the end of the hold period associated with the change of the first digital value to the second digital value and the beginning of a hold period associated with a change of the last digital value of the k consecutive zero digital values to a next digital value.

5. The DAC according to claim 1, wherein the one or more controllers are further configured to, for the each DAC cell of the plurality of DAC cells,
    delay input data samples by a number of clock cycles sufficient to allow for a look-ahead set up time to identify digital values within a sequence of k consecutive digital values.

6. The DAC according to claim 1, wherein each DAC cell comprises a pair of current sources configured, when connected, to conduct current through the DAC cell, and wherein the one or more controllers being configured to prevent the DAC cell from conducting current comprises:
    the one or more controllers being configured to disconnect the pair of current sources of the DAC cell.

7. An apparatus for controlling a three-level current steering DAC cell configured to maintain an analog output associated with a conversion of each digital value to a next digital value for a hold period associated with the each digital value changing to the next digital value, the apparatus comprising:
    means for determining that, for a first digital value changing to a second digital value, the second digital value is zero;
    means for identifying that the second digital value is the first zero value of k consecutive zero digital values, k being an integer equal to or greater than two, and
    means for preventing the three-level DAC cell from conducting current at least during a time period between the end of a hold period associated with the change of the first digital value to the second digital value and the beginning of a hold period associated with a change of a digital value that is one before last of the k consecutive zero digital values to a digital value that is the last digital value of the k consecutive zero digital values.

8. The apparatus according to claim 7, further comprising:
    means for identifying that a digital value immediately following the last digital value of the k consecutive zero digital values is a non-zero value;
    means for allowing the three-level DAC cell to conduct current during at least a portion of the hold period associated with the change of the digital value that is one before last of the k consecutive zero digital values to the last digital value of the k consecutive zero digital values; and
    means for preventing the three-level DAC cell from conducting current during a time period between the end of the hold period associated with the change of the digital value that is one before last of the k consecutive zero digital values to the last digital value of the k consecutive zero digital values and the beginning of a hold period associated with a change of the last digital value of the k consecutive zero digital values to the digital value immediately following the last digital value of the k consecutive zero digital values.

9. The apparatus according to claim 7, further comprising:
means for identifying that a digital value immediately following the last digital value of the k consecutive zero digital values is a non-zero value;
means for allowing the three-level DAC cell to conduct current during at least a portion of the hold period associated with the change of the digital value that is one before last of the k consecutive zero digital values to the last digital value of the k consecutive zero digital values; and
means for allowing the three-level DAC cell to conduct current during a time period between the end of the hold period associated with the change of the digital value that is one before last of the k consecutive zero digital values to the last digital value of the k consecutive zero digital values and the beginning of a hold period associated with a change of the last digital value of the k consecutive zero digital values to the digital value immediately following the last digital value of the k consecutive zero digital values.

10. The apparatus according to claim 7, wherein the means for preventing comprises:
means for preventing the three-level DAC cell from conducting current during a time period between the end of the hold period associated with the change of the first digital value to the second digital value and the beginning of a hold period associated with a change of the last digital value of the k consecutive zero digital values to a next digital value.

11. The apparatus according to claim 7, further comprising:
means for delaying input data samples by a number of clock cycles sufficient to allow for a look-ahead set up time to identify digital values within a sequence of k consecutive digital values.

12. A method for controlling a three-level current steering DAC cell configured to maintain an analog output associated with a conversion of each digital value to a next digital value for a hold period associated with the each digital value changing to the next digital value, the method comprising:
determining that, for a first digital value changing to a second digital value, the second digital value is zero;
identifying that the second digital value is the first zero value of k consecutive zero digital values, k being an integer equal to or greater than two, and
preventing the three-level DAC element from conducting current at least during a time period between the end of a hold period associated with the change of the first digital value to the second digital value and the beginning of a hold period associated with a change of a digital value that is one before last of the k consecutive zero digital values to a digital value that is the last digital value of the k consecutive zero digital values.

13. The method according to claim 12, further comprising:
identifying that a digital value immediately following the last digital value of the k consecutive zero digital values is a non-zero value;
allowing the three-level DAC element to conduct current during at least a portion of the hold period associated with the change of the digital value that is one before last of the k consecutive zero digital values to the last digital value of the k consecutive zero digital values; and
preventing the three-level DAC element from conducting current during a time period between the end of the hold period associated with the change of the digital value that is one before last of the k consecutive zero digital values to the last digital value of the k consecutive zero digital values and the beginning of a hold period associated with a change of the last digital value of the k consecutive zero digital values to the digital value immediately following the last digital value of the k consecutive zero digital values.

14. The method according to claim 12, further comprising:
identifying that a digital value immediately following the last digital value of the k consecutive zero digital values is a non-zero value;
allowing the three-level DAC element to conduct current during at least a portion of the hold period associated with the change of the digital value that is one before last of the k consecutive zero digital values to the last digital value of the k consecutive zero digital values; and
allowing the three-level DAC element to conduct current during a time period between the end of the hold period associated with the change of the digital value that is one before last of the k consecutive zero digital values to the last digital value of the k consecutive zero digital values and the beginning of a hold period associated with a change of the last digital value of the k consecutive zero digital values to the digital value immediately following the last digital value of the k consecutive zero digital values.

15. The method according to claim 12, wherein the preventing comprises:
preventing the three-level DAC element from conducting current during a time period between the end of the hold period associated with the change of the first digital value to the second digital value and the beginning of a hold period associated with a change of the last digital value of the k consecutive zero digital values to a next digital value.

16. The method according to claim 12, further comprising:
delaying input data samples by a number of clock cycles sufficient to allow for a look-ahead set up time to identify digital values within a sequence of k consecutive digital values.

17. A digital-to-analog converter (DAC) comprising:
a plurality of DAC cells, each DAC cell comprising a three-level current steering DAC cell configured to maintain an analog output associated with a conversion of each digital value provided to the DAC cell to a next digital value for a hold period associated with the each digital value changing to the next digital value; and
one or more controllers for controlling the plurality of DAC cells,
wherein the one or more controllers are configured to, for each DAC cell of the plurality of DAC cells,
determine that a first digital value provided to the DAC cell changes to a second digital value, the second digital value being zero, and
prevent the DAC cell from conducting current at least during a time period between the end of a hold period associated with the change of the first digital value to the second digital value and the beginning of a next hold period.

18. The DAC according to claim 17, wherein:
the next hold period is associated with the second digital value changing to a third digital value, and
each of the first digital value and the third digital value is a non-zero value.

19. The DAC according to claim 17, wherein the hold period associated with the change of the first digital value to the second digital value comprises a time period when a DAC flip-flop output changes from the first digital value to the second digital value.

20. The DAC according to claim 19, wherein the next hold period comprises a time period when the DAC flip-flop output changes from the second digital value to the next digital value.

21. An apparatus for controlling a three-level current steering DAC cell configured to maintain an analog output associated with a conversion of each digital value to a next digital value for a hold period associated with the each digital value changing to the next digital value, the apparatus comprising:
means for determining that, for a first digital value changing to a second digital value, the second digital value is zero; and
means for preventing the three-level DAC cell from conducting current at least during a time period between the end of a hold period associated with the change of the first digital value to the second digital value and the beginning of a next hold period.

22. The apparatus according to claim 21, wherein:
the next hold period is associated with the second digital value changing to a third digital value, and
each of the first digital value and the third digital value is a non-zero value.

23. The apparatus according to claim 21, wherein the hold period associated with the change of the first digital value to the second digital value comprises a time period when a DAC flip-flop output changes from the first digital value to the second digital value.

24. A method for controlling a three-level current steering DAC cell configured to maintain an analog output associated with a conversion of each digital value to a next digital value for a hold period associated with the each digital value changing to the next digital value, the method comprising:
determining that, for a first digital value changing to a second digital value, the second digital value is zero; and
preventing the three-level DAC cell from conducting current at least during a time period between the end of a hold period associated with the change of the first digital value to the second digital value and the beginning of a next hold period.

25. The method according to claim 24, wherein:
the next hold period is associated with the second digital value changing to a third digital value, and
each of the first digital value and the third digital value is a non-zero value.

26. The method according to claim 24, wherein the hold period associated with the change of the first digital value to the second digital value comprises a time period when a DAC flip-flop output changes from the first digital value to the second digital value.

* * * * *